US012787569B2

(12) United States Patent
Feng et al.

(10) Patent No.: US 12,787,569 B2
(45) Date of Patent: Nov. 3, 2026

(54) DISPLAY PANEL AND DISPLAY DEVICE

(71) Applicant: BOE Technology Group Co., Ltd., Beijing (CN)

(72) Inventors: Yu Feng, Beijing (CN); Libin Liu, Beijing (CN); Li Wang, Beijing (CN); Jianchao Zhu, Beijing (CN); Shiming Shi, Beijing (CN); Jingquan Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 375 days.

(21) Appl. No.: 18/290,438

(22) PCT Filed: Jun. 29, 2022

(86) PCT No.: PCT/CN2022/102386

§ 371 (c)(1),
(2) Date: Nov. 13, 2023

(87) PCT Pub. No.: WO2024/000273

PCT Pub. Date: Jan. 4, 2024

(65) Prior Publication Data

US 2025/0089489 A1 Mar. 13, 2025

(51) Int. Cl.

*H10K 59/131* (2023.01)
*G09G 3/3233* (2016.01)
*H10K 59/121* (2023.01)

(52) U.S. Cl.

CPC ......... *H10K 59/131* (2023.02); *G09G 3/3233* (2013.01); *H10K 59/1213* (2023.02);

(Continued)

(58) Field of Classification Search

CPC ............. H10K 59/131; H10K 59/1213; H10K 59/123; G09G 3/3233; G09G 2300/0426; G09G 3/32

See application file for complete search history.

(56) References Cited

U.S. PATENT DOCUMENTS 9,842,537 B2 12/2017 Lim et al.
2016/0203794 A1 7/2016 Lim et al.

(Continued)

FOREIGN PATENT DOCUMENTS

CN 202443728 U 9/2012
CN 106228942 A 12/2016

(Continued)

OTHER PUBLICATIONS

The Extend International Search Report of Application No. PCT/CN2022/102386, Dated on Mar. 23, 2023,(56P).

(Continued)

*Primary Examiner* — Xuemei Zheng
(74) *Attorney, Agent, or Firm* — Arch & Lake LLP

(57) ABSTRACT

A display panel and a display device are provided. The display panel includes a base substrate and a pixel driving circuit provided on a side of the base substrate, and the pixel driving circuit includes a driving transistor, ninth transistor, eighth transistor, first transistor and second transistor. A first electrode of the ninth transistor is connected to a third initial signal line and a second electrode of the ninth transistor is connected to a first electrode of the driving transistor. A first electrode of the eighth transistor is connected to a gate electrode of the driving transistor. A first electrode of the first transistor is connected to a first initial signal line and a second electrode of the first transistor is connected to a second electrode of the eighth transistor. A first electrode of the second transistor is connected to the second electrode of the eighth transistor and a second electrode of the second (Continued)

transistor is connected to a second electrode of the driving transistor.

18 Claims, 21 Drawing Sheets

(52) U.S. Cl.
CPC ............... *G09G 2300/0426* (2013.01); *G09G 2300/0819* (2013.01); *G09G 2300/0842* (2013.01); *G09G 2310/08* (2013.01); *G09G 2320/0233* (2013.01); *G09G 2320/0252* (2013.01)

(56) References Cited

U.S. PATENT DOCUMENTS

| | | | | |
|---|---|---|---|---|
| 2021/0043713 | A1* | 2/2021 | Sun | H10K 59/124 |
| 2021/0193766 | A1 | 6/2021 | Liu et al. | |
| 2021/0193776 | A1 | 6/2021 | Wang | |
| 2021/0225282 | A1 | 7/2021 | Cho et al. | |
| 2021/0343226 | A1 | 11/2021 | Okabe et al. | |
| 2021/0376026 | A1 | 12/2021 | Mou et al. | |
| 2023/0267888 | A1* | 8/2023 | Liu | G09G 3/3233 345/214 |
| 2024/0038161 | A1* | 2/2024 | Zeng | G09G 3/3233 |
| 2024/0046862 | A1* | 2/2024 | Dai | G09G 3/3233 |

FOREIGN PATENT DOCUMENTS

| | | | | |
|---|---|---|---|---|
| CN | 107610651 | A | 1/2018 | |
| CN | 107818755 | A | 3/2018 | |
| CN | 109285500 | A | 1/2019 | |
| CN | 211265478 | U | 8/2020 | |
| CN | 112397565 | A | 2/2021 | |
| CN | 112562588 | A | 3/2021 | |
| CN | 112802431 | A | 5/2021 | |
| CN | 112885850 | A | 6/2021 | |
| CN | 112967682 | A | 6/2021 | |
| CN | 113838424 | A | 12/2021 | |
| CN | 114093299 | A | 2/2022 | |
| CN | 114120881 | A | 3/2022 | |
| CN | 114122101 | A | 3/2022 | |
| CN | 114207703 | A | 3/2022 | |
| CN | 114258320 | A | 3/2022 | |
| EP | 3293767 | A2 | 3/2018 | |
| JP | H117046 | A | 1/1999 | |
| WO | 2021102972 | A1 | 6/2021 | |
| WO | WO-2023159503 | A1 * | 8/2023 | G09G 3/3233 |

OTHER PUBLICATIONS

Written Opinion of TIIE International Searching Authority No. PCT/CN2022/102386, Dated on Mar. 23, 2023,(3P).
Supplementary European Search Report of EP Application No. 22948388.8 dated Jun. 12, 2025, (25p).
Extended European Search Report of EP Application No. 22948388.8 dated Oct. 22, 2025, (29p).
First Office Action of CN Application No. 202280002001.2 dated Apr. 27, 2026, (29p).

* cited by examiner

DISPLAY PANEL AND DISPLAY DEVICE

CROSS-REFERENCE TO RELATED APPLICATIONS

The present application is a U.S. National Stage of International Application No. PCT/CN2022/102386 filed on Jun. 29, 2022, the entire contents thereof are incorporated herein by reference.

TECHNICAL FIELD

The present disclosure relates to the field of display technology, in particular, to a display panel and a display device.

BACKGROUND

In the related technology, hysteretic in a driving transistor causes residual images in a display panel.

It is to be noted that the above information disclosed in the Background section is only for enhancement of understanding of the background of the present disclosure and therefore it may contain information that does not form the prior art that is already known to a person skilled in the art.

SUMMARY

An aspect of the present disclosure provides a display panel including a base substrate and a pixel driving circuit provided on a side of the base substrate. The pixel driving circuit includes: a driving transistor; a ninth transistor having a first electrode connected to a third initial signal line and a second electrode connected to a first electrode of the driving transistor; an eighth transistor having a first electrode connected to a gate electrode of the driving transistor; a first transistor having a first electrode connected to a first initial signal line and a second electrode connected to a second electrode of the eighth transistor; and a second transistor having a first electrode connected to the second electrode of the eighth transistor and a second electrode connected to a second electrode of the driving transistor.

In an exemplary embodiment of the present disclosure, the display panel includes a plurality of the pixel driving circuits, the plurality of the pixel driving circuits are arranged in an array along a first direction and a second direction, and the first direction is intersected with the second direction, the pixel driving circuit further includes a capacitor having a first electrode connected to the gate electrode of the driving transistor and a second electrode connected to a first power line, and the display panel further includes: a second conductive layer provided on a side of the base substrate and including a second conductive part, the second conductive part being configured to form the second electrode of the capacitor; a fourth conductive layer provided on a side of the second conductive layer away from the base substrate and including a power connection line, an orthographic projection of the power connection line on the base substrate extending in the first direction, the power connection line being respectively connected to a plurality of the second conductive parts through via holes, orthographic projections, on the base substrate, of the plurality of the second conductive parts connected to a same power connection line being spaced apart along the first direction; and a fifth conductive layer provided on a side of the fourth conductive layer away from the base substrate and including the first power line, an orthographic projection of the first power line on the base substrate extending in the second direction, and the first power line being connected to the power connection line with the orthographic projection on the base substrate intersecting with the orthographic projection of the first power line on the base substrate.

In an exemplary embodiment of the present disclosure, the display panel further includes: a sixth conductive layer provided on a side of the fifth conductive layer away from the base substrate and including a second power line, an orthographic projection of the second power line on the base substrate extending in the second direction, and the second power line being connected to the first power line through a via hole.

In an exemplary embodiment of the present disclosure, the display panel further includes a light-emitting unit, and the pixel driving circuit is connected to a first electrode of the light-emitting unit, the display panel further includes: a sixth conductive layer provided on a side of the base substrate and including a third power line, an orthographic projection of the third power line on the base substrate extending in a second direction; and a common electrode layer provided on a side of the sixth conductive layer away from the base substrate and configured to form a second electrode of the light-emitting unit, wherein the third power line is at least partially provided in a display area of the display panel, and the third power line is connected to the common electrode layer through a vial hole.

In an exemplary embodiment of the present disclosure, the display panel further includes a light-emitting unit, the pixel driving circuit further includes a seventh transistor having a first electrode connected to a second initial signal line and a second electrode connected to a first electrode of the light-emitting unit, and the display panel further includes: a second conductive layer provided on a side of the base substrate and including the second initial signal line, an orthographic projection of the second initial signal line on the base substrate extending in a first direction; and a sixth conductive layer provided on a side of the second conductive layer away from the base substrate and including a second initial connection line, the second initial connection line being connected to the second initial signal line with the orthographic projection on the base substrate intersected with an orthographic projection of the second initial connection line on the base substrate.

In an exemplary embodiment of the present disclosure, the display panel further includes: a second conductive layer provided on a side of the base substrate and including the first initial signal line, an orthographic projection of the first initial signal line on the base substrate extending in a first direction; and a sixth conductive layer provided on a side of the second conductive layer away from the base substrate and including a first initial connection line, the first initial connection line being connected to the first initial signal line with the orthographic projection on the base substrate intersected with an orthographic projection of the first initial connection line on the base substrate.

In an exemplary embodiment of the present disclosure, the display panel further includes: a third conductive layer provided on a side of the base substrate and including the third initial signal line, an orthographic projection of the third initial signal line on the base substrate extending in a first direction; and a sixth conductive layer provided on a side of the third conductive layer away from the base substrate and including a third initial connection line, the third initial connection line being connected to the third initial signal line with the orthographic projection on the base substrate intersected with an orthographic projection of the third initial connection line on the base substrate.

In an exemplary embodiment of the present disclosure, the display panel further includes: a first conductive layer provided on a side of the base substrate and including a first conductive part configured to form the gate electrode of the driving transistor; a second active layer provided on a side of the first conductive layer away from the base substrate and including a sub-active part, the sub-active part including an eighth active part and a twentieth active part connected to the eighth active part, and the eighth active part being configured to form a channel region of the eighth transistor; and a fourth conductive layer provided on a side of the second active layer away from the base substrate and including a fourth bridging part, the fourth bridging part being connected to the twentieth active part through a first via hole and to the first conductive part through a second via hole.

In an exemplary embodiment of the present disclosure, the display panel further includes: a first active layer provided between the base substrate and the first conductive layer and including a second active part, the second active part being configured to form a channel region of the second transistor, the first conductive layer further includes: a first gate line, an orthographic projection of the first gate line on the base substrate extending in a first direction and covering an orthographic projection of the second active part on the base substrate, and a portion of the first gate line being configured to form a gate electrode of the second transistor; and a third conductive part connected to the first gate line, an orthographic projection of the third conductive part on the base substrate being located at a side, facing an orthographic projection of the first conductive part on the base substrate, of the orthographic projection of the first gate line on the base substrate, wherein the orthographic projection of the third conductive part on the base substrate is at least partially overlapped with an orthographic projection of the first via hole on the base substrate.

In an exemplary embodiment of the present disclosure, the pixel driving circuit further includes a fifth transistor having a first electrode connected to a first power line and a second electrode connected to the first electrode of the driving transistor, the display panel further includes: a fifth conductive layer provided on a side of the fourth conductive layer away from the base substrate and including the first power line, an orthographic projection of the first power line on the base substrate extending in a second direction, and covering an orthographic projection of the sub-active part on the base substrate and an orthographic projection of the fourth bridging part on the base substrate.

In an exemplary embodiment of the present disclosure, the pixel driving circuit further includes a fourth transistor having a first electrode connected to a data line and a second electrode connected to the first electrode of the driving transistor, the display panel further includes: a first active layer provided between the base substrate and the first conductive layer and including a second active part and a fourth active part, the second active part being configured to form a channel region of the second transistor, and the fourth active part being configured to form a channel region of the fourth transistor, and in a first direction, an orthographic projection of the eighth active part on the base substrate is located between an orthographic projection of the second active part on the base substrate and an orthographic projection of the fourth active part on the base substrate.

In an exemplary embodiment of the present disclosure, the display panel includes a plurality of the pixel driving circuits and a light-emitting unit corresponding to the pixel driving circuit, the pixel driving circuit further includes a sixth transistor having a first electrode connected to the second electrode of the driving transistor, and the display panel further includes: a sixth conductive layer provided on a side of the base substrate and including a plurality of fourteenth bridging parts, the fourteenth bridging part being provided in correspondence with the pixel driving circuit and being connected to a second electrode of the sixth transistor in the pixel driving circuit corresponding to the fourteenth bridging part; and an electrode layer provided on a side of the sixth conductive layer away from the base substrate and including a plurality of electrode parts, the electrode part being configured to form a first electrode of the light-emitting unit, and being connected, through a via hole, to the fourteenth bridging part corresponding to the electrode part, the plurality of electrode parts includes a first electrode part, a second electrode part, and a third electrode part, the first electrode part is configured to form a first electrode of a first color light-emitting unit, the second electrode part is configured to form a first electrode of a second color light-emitting unit, and the third electrode part is configured to form a first electrode of a third color light-emitting unit, wherein an orthographic projection, on the base substrate, of the fourteenth bridging part connected to the first electrode part has a dimension of S1 in a second direction, an orthographic projection, on the base substrate, of the fourteenth bridging part connected to the second electrode part has a dimension of S2 in the second direction, and an orthographic projection, on the base substrate, of the fourteenth bridging part connected to the third electrode part has a dimension of S3 in the second direction, where S1 is greater than S2 and S3.

In an exemplary embodiment of the present disclosure, the display panel further includes: a first conductive layer provided between the base substrate and the sixth conductive layer and including a first gate line, a portion of the first gate line being configured to form a gate electrode of the second transistor, wherein an orthographic projection of the fourteenth bridging part connected to the first electrode part on the base substrate is intersected with an orthographic projection of the first gate line on the base substrate.

In an exemplary embodiment of the present disclosure, the display panel further includes a light-emitting unit, and the pixel driving circuit further includes: a fourth transistor having a first electrode connected to a data line and a second electrode connected to the first electrode of the driving transistor; a fifth transistor having a first electrode connected to a first power line and a second electrode connected to the first electrode of the driving transistor; a sixth transistor having a first electrode connected to the second electrode of the driving transistor and a second electrode connected to a first electrode of the light-emitting unit; and a seventh transistor having a first electrode connected to a second initial signal line and a second electrode connected to the first electrode of the light-emitting unit. The display panel further includes: a first active layer provided on a side of the base substrate and including a first active part, a second active part, a third active part, a fourth active part, a fifth active part, a sixth active part, a seventh active part, and a ninth active part; wherein the first active part is configured to form a channel region of the first transistor, the second active part is configured to form a channel region of the second transistor, the third active part is configured to form a channel region of the driving transistor, the fourth active part is configured to form a channel region of the fourth transistor, the fifth active part is configured to form a channel region of the fifth transistor, the sixth active part is configured to form a channel region of the sixth transistor, the seventh active part is configured to form a channel region of the seventh transistor, and the ninth active part is configured to form a channel region of the ninth transistor, a first conductive layer is provided on a side of the first active layer away from the base substrate and including a first reset signal line, a second reset signal line, an enable signal line, a first gate line, and a first conductive part, wherein an orthographic projection of the first conductive part on the base substrate covers an orthographic projection of the third active part on the base substrate, and the first conductive part is configured to form the gate electrode of the driving transistor, an orthographic projection of the first reset signal line on the base substrate extends in a first direction and covers the orthographic projection of the first active part on the base substrate, and a portion of the first reset signal line is configured to form a gate electrode of the first transistor, an orthographic projection of the second reset signal line on the base substrate extends in the first direction and coves an orthographic projection of the seventh active part on the base substrate and an orthographic projection of the ninth active part on the base substrate, a portion of the first reset signal line is configured to form a gate electrode of the seventh transistor, and another portion of the first reset signal line is configured to form a gate electrode of the ninth transistor, an orthographic projection of the first gate line on the base substrate extends in the first direction and covers an orthographic projection of the second active part on the base substrate and an orthographic projection of the fourth active part on the base substrate, a portion of the first gate line is configured to form a gate electrode of the second transistor, and another portion of the first gate line is configured to form a gate electrode of the fourth transistor, the orthographic projection of the first conductive part on the base substrate is located between an orthographic projection of the enable signal line on the base substrate and the orthographic projection of the first gate line on the base substrate, the orthographic projection of the first reset signal line on the base substrate is located at a side, away from the orthographic projection of the first conductive part on the base substrate, of the orthographic projection of the first gate line on the base substrate, and the orthographic projection of the second reset signal line on the base substrate is located at a side, away from the orthographic projection of the first conductive part on the base substrate, of the orthographic projection of the enable signal line on the base substrate.

In an exemplary embodiment of the present disclosure, the first reset signal line in the pixel driving circuit in a current row is reused as the second reset signal line in the pixel driving circuit in an adjacent previous row.

In an exemplary embodiment of the present disclosure, the display panel further includes: a second active layer provided on a side of the first conductive layer away from the base substrate and including an eighth active part, the eighth active part being configured to form a channel region for the eighth transistor; a third conductive layer provided on a side of the second active layer away from the base substrate and including a second gate line, an orthographic projection of the second gate line on the base substrate covering an orthographic projection of the eighth active part on the base substrate, and a portion of the second gate line being configured to form a top gate of the eighth transistor, the orthographic projection of the second gate line on the base substrate is located between the orthographic projection of the first gate line on the base substrate and the orthographic projection of the first reset signal line on the base substrate.

In an exemplary embodiment of the present disclosure, the display panel further includes: a second conductive layer provided between the first conductive layer and the second active layer and including the first initial signal line and the second initial signal line, wherein in the pixel driving circuit in a same row, an orthographic projection of the first initial signal line on the base substrate is located at a side, away from the orthographic projection of the first conductive part on the base substrate, of the orthographic projection of the first reset signal line on the base substrate, an orthographic projection, on the base substrate, of the second initial signal line in the pixel driving circuit in an adjacent previous row is located between the orthographic projection, on the base substrate, of the first reset signal line in the pixel driving circuit in a current row and the orthographic projection, on the base substrate, of the second gate line in the pixel driving circuit in the current row, the third conductive layer further includes: the third initial signal line, an orthographic projection, on the base substrate, of the third initial signal line in the pixel driving circuit in the adjacent previous row being located between the orthographic projection, on the base substrate, of the second initial signal line in the pixel driving circuit in the adjacent previous row and the orthographic projection, on the base substrate, of the first reset signal line in the pixel driving circuit in the current row.

In an exemplary embodiment of the present disclosure, the first transistor, the second transistor, the driving transistor, the fourth transistor, the fifth transistor, the sixth transistor, the seventh transistor and the ninth transistor are P-type transistors, and the eighth transistor is an N-type transistor.

In an exemplary embodiment of the present disclosure, the display panel further includes: a first conductive layer provided on a side of the base substrate and including a gate line, the gate line including a plurality of gate line sections, orthographic projections, on the base substrate, of the plurality of gate line sections of a same gate line being spaced apart in a first direction and extending in the first direction, and a portion of the gate line being configured to form a gate electrode of a transistor in the pixel driving circuit; and a fourth conductive layer provided on a side of the first conductive layer away from the base substrate and including a gate line-connecting line, the orthographic projection of the gate line-connecting lines on the base substrate extending in the first direction and being respectively connected to the plurality of gate line sections of the same gate line through via holes, wherein a square resistance of the first conductive layer is greater than a square resistance of the fourth conductive layer.

An aspect of the present disclosure provides a display device including the display panel described above.

It should be understood that the above general description and the detailed descriptions that follow are only exemplary and explanatory and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that according to these accompanying drawings, a person skilled in the art may obtain other accompanying drawings without creative effort.

DETAILED DESCRIPTION

Figure 1:
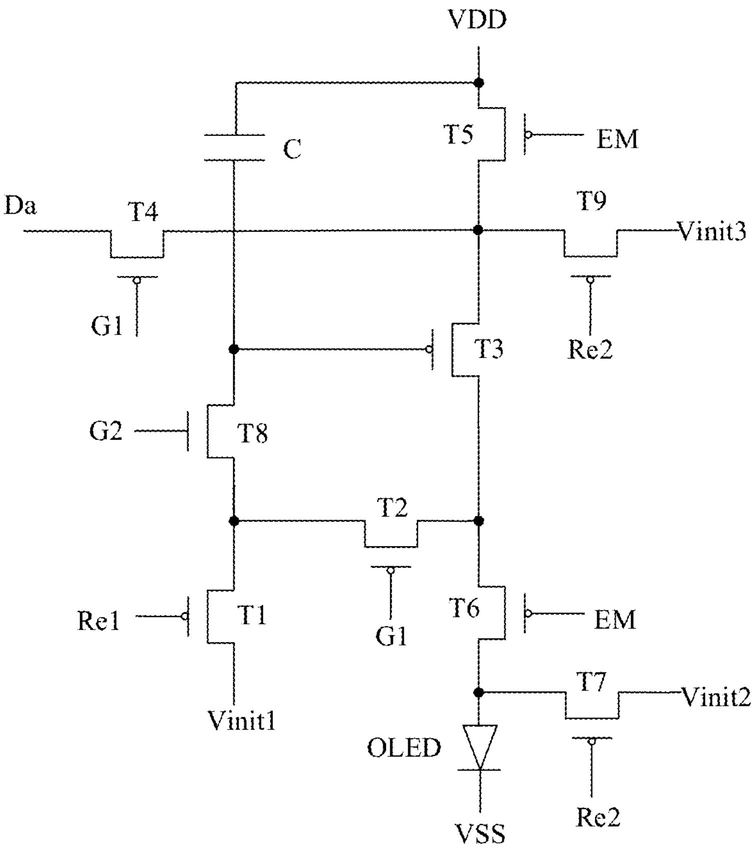
FIG. 1 is a schematic circuit structure diagram of a pixel driving circuit of a display panel according to an exemplary embodiment of the present disclosure.

Example embodiments will now be described more fully with reference to the accompanying drawings. Example embodiments, however, may be embodied in various forms and should not be construed as being limited to the examples set forth herein; rather, these embodiments are provided so that the present disclosure will be thorough and complete, and the concept of example embodiments would be fully conveyed to a person skilled in the art. The same reference numerals in the drawings denote the same or similar structures, and thus their detailed descriptions will be omitted.

The terms "a", "an" and "the" are used to indicate the presence of one or more elements/components/etc.; the terms "including" and "having" are used to indicate an open-ended inclusive meaning and that additional elements/components/etc. may be present in addition to the listed elements/components/etc.

FIG. 1 is a schematic circuit structure diagram of a pixel driving circuit of a display panel according to an exemplary embodiment of the present disclosure. The pixel driving circuit may include a first transistor T1, a second transistor T2, a driving transistor T3, a fourth transistor T4, a fifth transistor T5, a sixth transistor T6, a seventh transistor T7, an eighth transistor T8, a ninth transistor T9, and a capacitor C.

A first electrode of the eighth transistor T8 is connected to a gate electrode of the driving transistor T3, and a gate electrode of the eighth transistor T8 is connected to a second gate driving signal terminal G2. A first electrode of the first transistor T1 is connected to a first initial signal terminal Vinit1, a second electrode of the first transistor T1 is connected to a second electrode of the eighth transistor T8, and a gate electrode of the first transistor T1 is connected to a first reset signal terminal Re1. A first electrode of the second transistor T2 is connected to the second electrode of the eighth transistor T8, a second electrode of the second transistor T2 is connected to a second electrode of the driving transistor T3, and a gate electrode of the second transistor T2 is connected to a first gate driving signal terminal G1. A first electrode of the fourth transistor T4 is connected to a data signal terminal Da, a second electrode of the fourth transistor T4 is connected to a first electrode of the driving transistor T3, and a gate electrode of the fourth transistor T4 is connected to the first gate driving signal terminal G1. A first electrode of the fifth transistor T5 is connected to a first power supply terminal VDD, a second electrode of the fifth transistor T5 is connected to the first electrode of the driving transistor T3, and a gate electrode of the fifth transistor T5 is connected to an enable signal terminal EM. A first electrode of the sixth transistor T6 is connected to the second electrode of the driving transistor T3, and a gate electrode of the sixth transistor T6 is connected to the enable signal terminal EM. A first electrode of the seventh transistor T7 is connected to a second initial signal terminal Vinit2, a second electrode of the seventh transistor T7 is connected to a second electrode of the sixth transistor T6, and a gate electrode of the seventh transistor T7 is connected to a second reset signal terminal Re2. A first electrode of the ninth transistor T9 is connected to a third initial signal terminal Vinit3, a second electrode of the ninth transistor T9 is connected to the first electrode of the driving transistor T3, and a gate electrode of the ninth transistor T9 is connected to the second reset signal terminal Re2. A first electrode of the capacitor is connected to the gate electrode of the driving transistor, and a second electrode of the capacitor is connected to the first power supply terminal VDD. The pixel driving circuit may be used to drive a light-emitting unit OLED to emit light, a first electrode of the light-emitting unit OLED is connected to the second electrode of the sixth transistor T6, and a second electrode of the light-emitting unit OLED is connected to a second power supply terminal VSS. The first transistor T1, the second transistor T2, the driving transistor T3, the fourth transistor T4, the fifth transistor T5, the sixth transistor T6, the seventh transistor T7, and the ninth transistor T9 may all be P-type transistors, and the eighth transistor T8 may be an N-type transistor.

Figure 2:
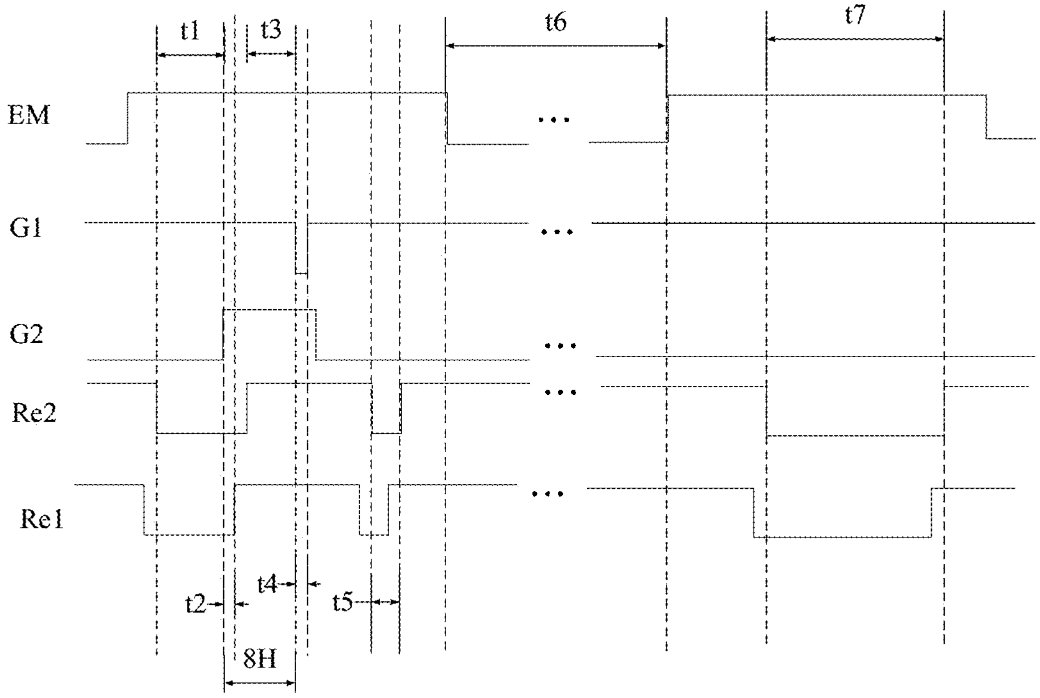
FIG. 2 is a timing diagram of signal on each node in the pixel driving circuit shown in FIG. 1.

FIG. 2 is a timing diagram of signal on each node in the pixel driving circuit shown in FIG. 1. EM denotes a timing diagram of signal on the enable signal terminal, G1 denotes a timing diagram of signal on the first gate driving signal terminal; G2 denotes a timing diagram of signal on the second gate driving signal terminal; Re1 denotes a timing diagram of signal on the first reset signal terminal; and Re2 denotes a timing diagram of signal on the second reset signal terminal.

A driving method of the pixel driving circuit in the present disclosure may include a reset stage t2, a data writing stage t4, and a light-emitting stage t6. In the reset stage t2, the second gate driving signal terminal G2 outputs a high level, the first reset signal terminal Re1 and the second reset signal terminal Re2 output a low level, the eighth transistor T8, the first transistor T1, the seventh transistor T7, and the ninth transistor T9 are turned on, the first initial signal terminal Vinit1 inputs a first initial signal to the gate electrode of the driving transistor T3 through the first transistor T1 and the eighth transistor T8, the second initial signal terminal Vinit2 inputs a second initial signal to the first electrode of the light-emitting unit through the seventh transistor T7, and the third initial signal terminal Vinit3 inputs a third initial signal to the first electrode of the driving transistor T3 through the ninth transistor T9. In the data writing stage t4, the second gate driving signal terminal G2 outputs a high level, the first gate driving signal terminal G1 outputs a low level signal, the eighth transistor T8, the second transistor T2, and the fourth transistor T4 are turned on, and the data signal terminal Da outputs a data signal to write a compensating voltage Vdata+Vth to the gate electrode of the driving transistor, where Vdata is a voltage of the data signal, and Vth is the threshold voltage of the driving transistor T3. In the light-emitting stage t6, the enable signal terminal EM outputs a low level signal, the fifth transistor T5 and the sixth transistor T6 are turned on, and the driving transistor T3 drives the light-emitting unit OLED to emit light under the action of the voltage Vdata+Vth at the gate electrode thereof. According to the output current formula of the driving transistor $I=(\mu WCox/2L)(Vgs-Vth)^2$, where $\mu$ is a carrier mobility, Cox is a gate capacitance per unit area, W is a width of the channel of the driving transistor, L is a length of the channel of the driving transistor, Vgs is a gate-source voltage difference of the driving transistor, and Vth is the threshold voltage of the driving transistor, the output current I of the driving transistor in the pixel driving circuit of the present disclosure is $(\mu WCox/2L)(Vdata+Vth-Vdd-Vth)^2$. The pixel driving circuit can avoid the effect of the threshold of the driving transistor on the output current thereof.

In an exemplary embodiment, the display panel can reset the first electrode of the driving transistor T3 through the ninth transistor T9, and reset the gate electrode of the driving transistor T3 through the eighth transistor T8 and the first transistor T1, so that hysteresis of the driving transistor may be restored. In addition, the display panel, by being additionally provided with the eighth transistor T8, can reduce the leakage current of the gate electrode of the driving transistor T3 through the first transistor T1 and the second transistor T2.

As shown in FIG. 2, the driving method of the pixel driving circuit further includes a pre-reset stage t1, a hysteresis elimination stage t3, a re-reset stage t5, and a repeat reset stage t7. In the pre-reset stage t1, the second reset signal terminal Re2 outputs a low level signal, the ninth transistor T9 is turned on, and the third initial signal terminal Vinit3 pre-charges the first electrode of the driving transistor T3 with the third initial signal in advance, which setting can restore the hysteresis of the driving transistor T3 due to a bias voltage of a previous frame, thereby alleviating the residual image of the display panel. In the re-reset stage t5, the second reset signal terminal Re2 outputs a low level signal, the ninth transistor T9 is turned on, and the third initial signal terminal Vinit3 again supplies the third initial signal to the first electrode of the driving transistor T3, which setting also restores the hysteresis of the driving transistor T3. In the repeat reset stage t7, the second reset signal terminal Re2 outputs a low level signal, the seventh transistor T7 is turned on, and the second initial signal terminal Vinit2 inputs a second initial signal to the first electrode of the light-emitting unit OLED to reset the first electrode of the light-emitting unit OLED. The driving method of the pixel driving circuit may include a plurality of repeat reset stages t7 in a frame cycle.

As shown in FIG. 2, the duration of the pre-reset stage t1 may be 12 H; the duration between the rising edge of G2 in the reset stage t2 and the falling edge of G1 in the data writing stage t4 may be 8 H; the duration of the data writing stage t4 may be less than H; and the duration of the repeat reset stage t7 may be 56 H. H is a unit cycle duration. The voltage of the first initial signal may be −2 V to −5 V, for example, the voltage of the first initial signal may be −2 V, −3 V, −4 V, −5 V. The voltage of the second initial signal may be −2 V to −5 V, for example, the voltage of the second initial signal may be −2 V, −3 V, −4 V, −5 V. The voltage of the third initial signal may be 3 V to 7 V, for example, the third initial signal voltage may be 3 V, 4 V, 5 V, 6 V, 7 V.

Figure 3:
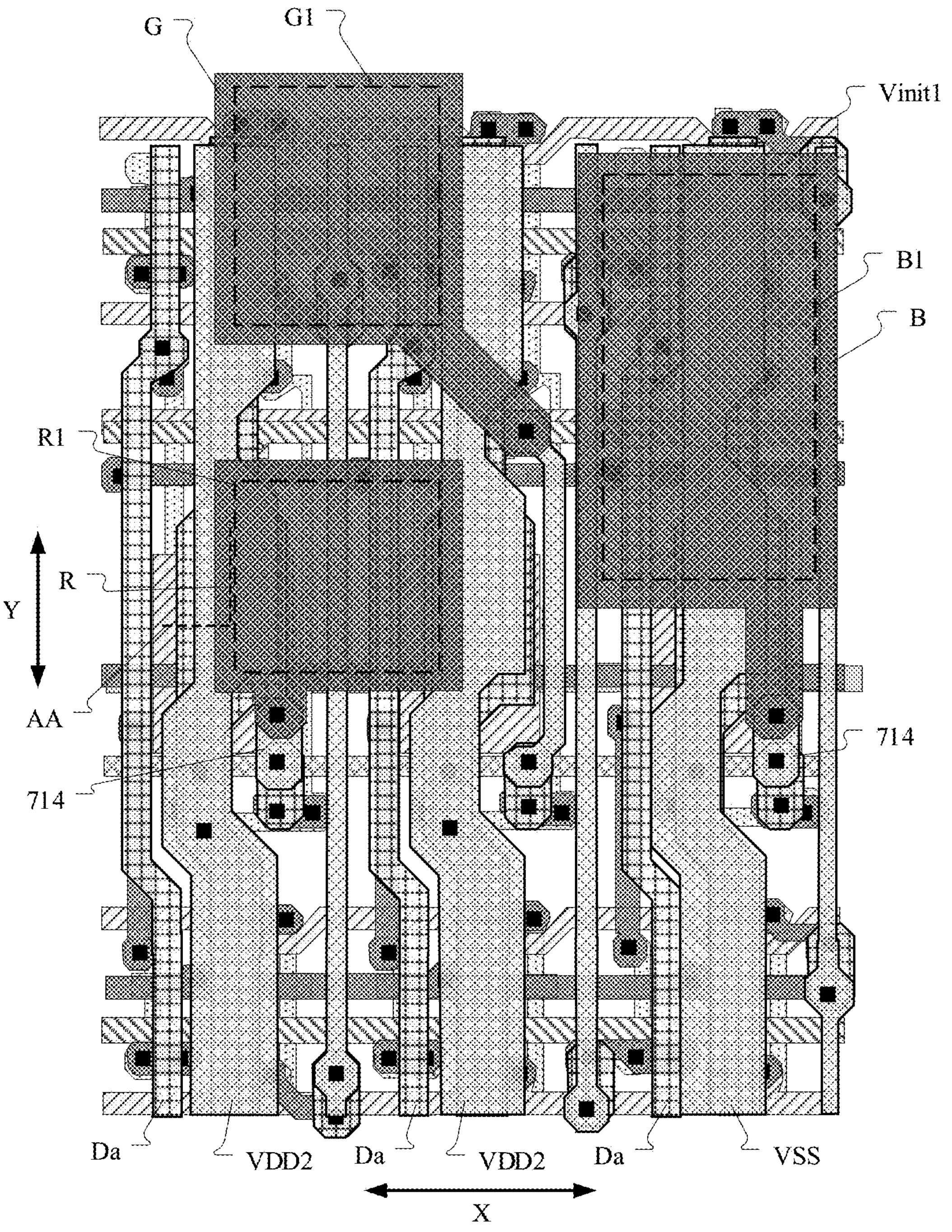
FIG. 3 is a structural layout of a display panel according to an exemplary embodiment of the present disclosure.
Figure 4:
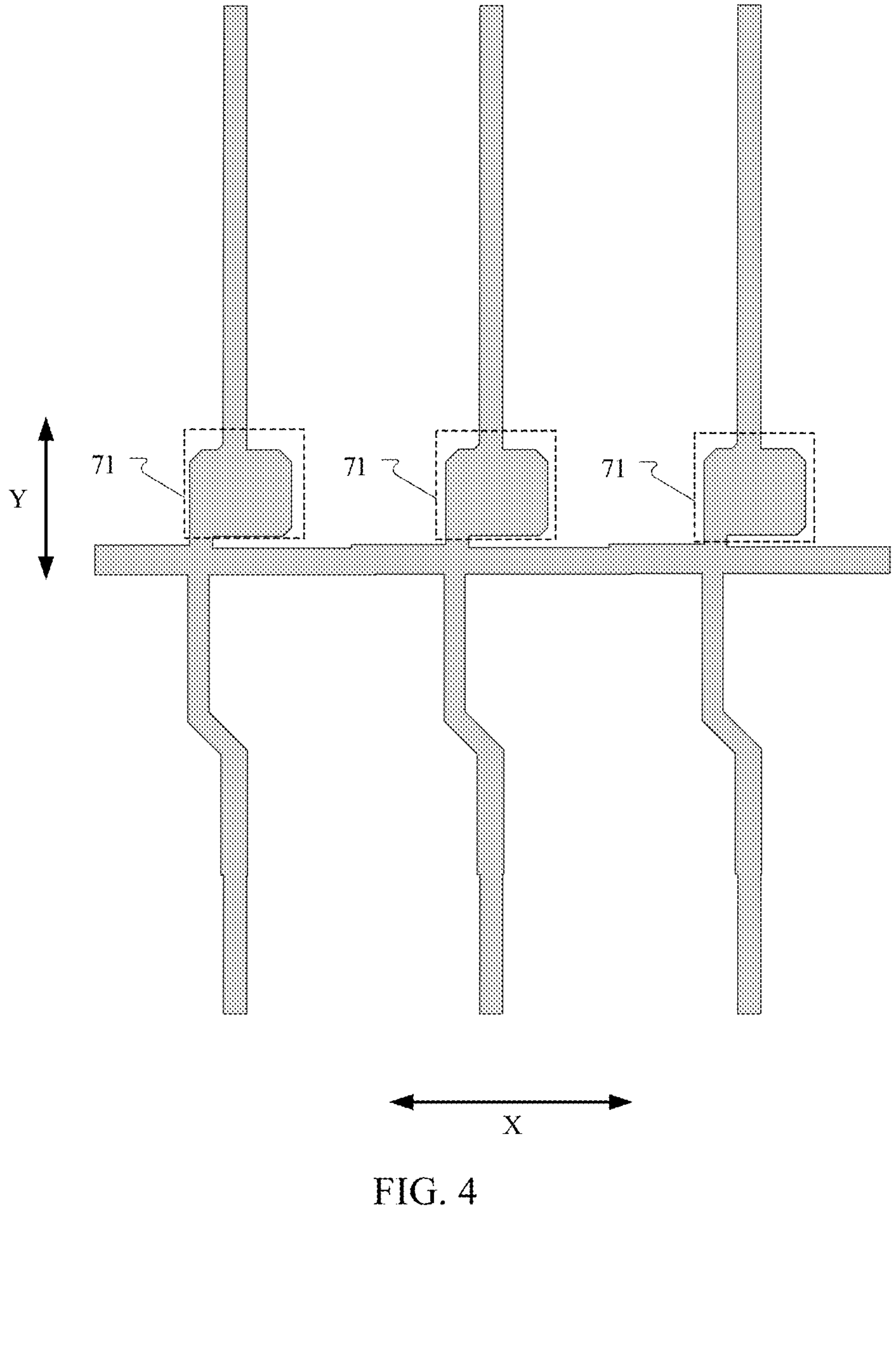
FIG. 4 is a structural layout of a shielding layer in FIG. 3.
Figure 5:
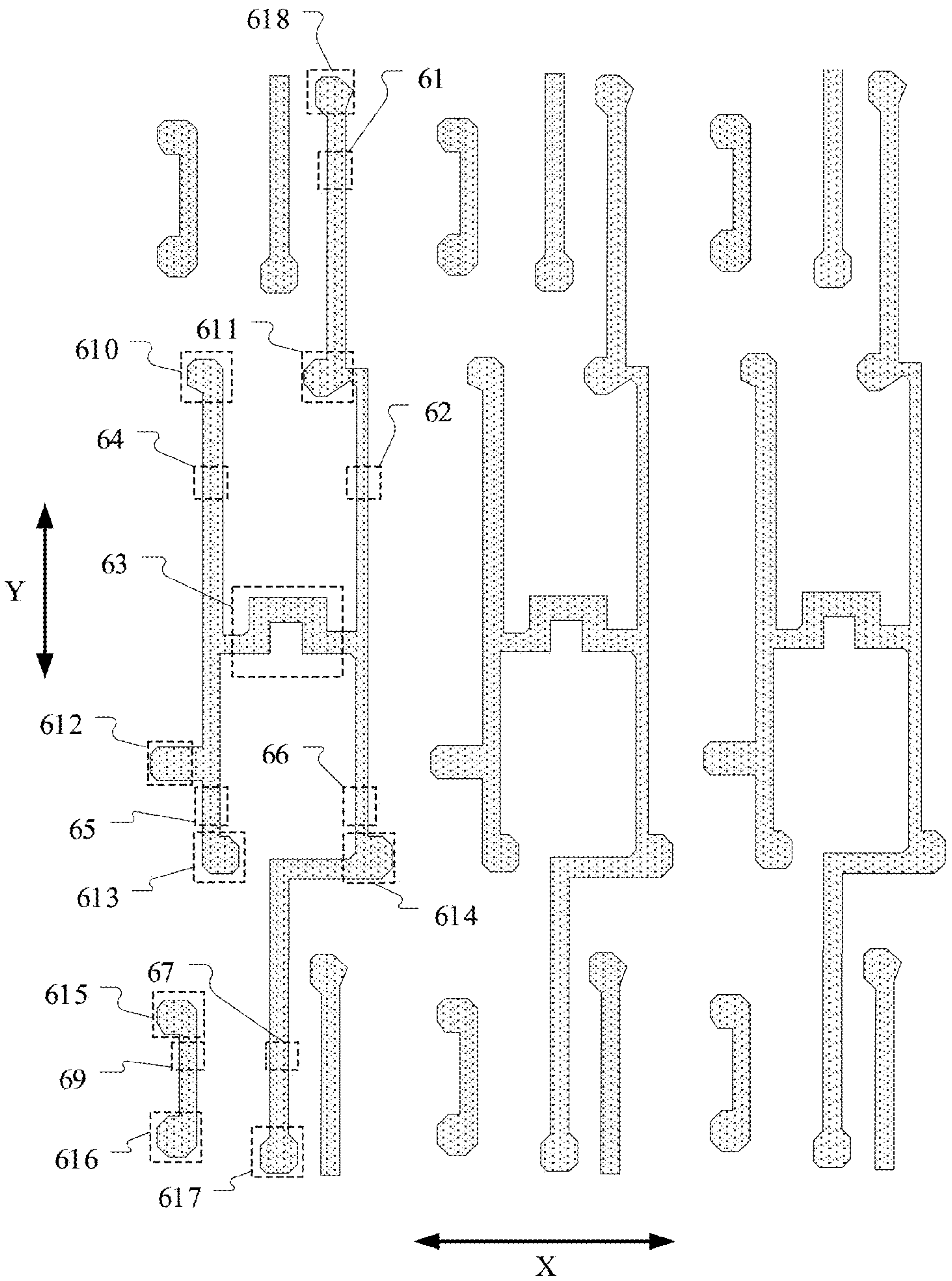
FIG. 5 is a structural layout of a first active layer in FIG. 3.
Figure 6:
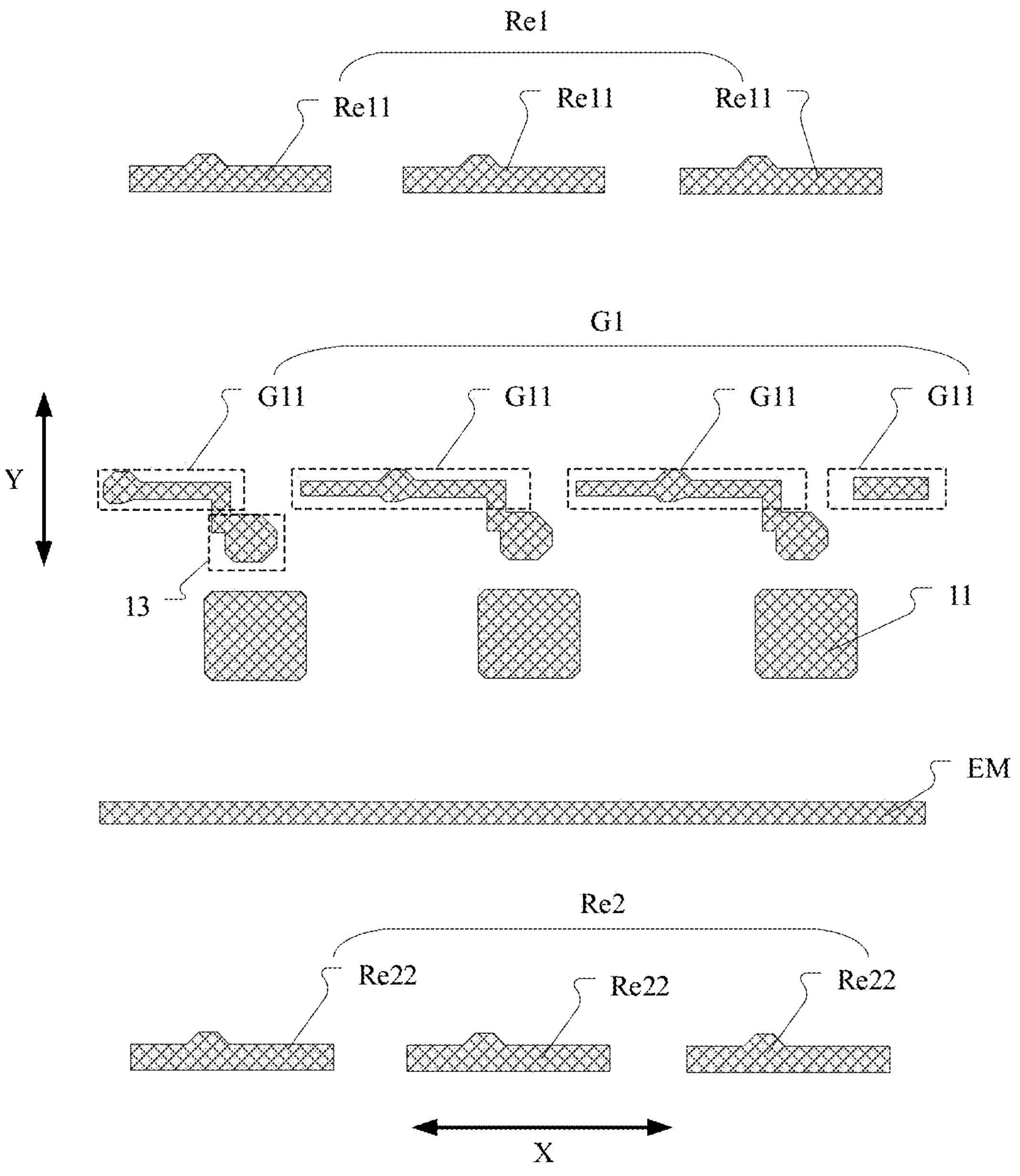
FIG. 6 is a structural layout of a first conductive layer in FIG. 3.
Figure 7:
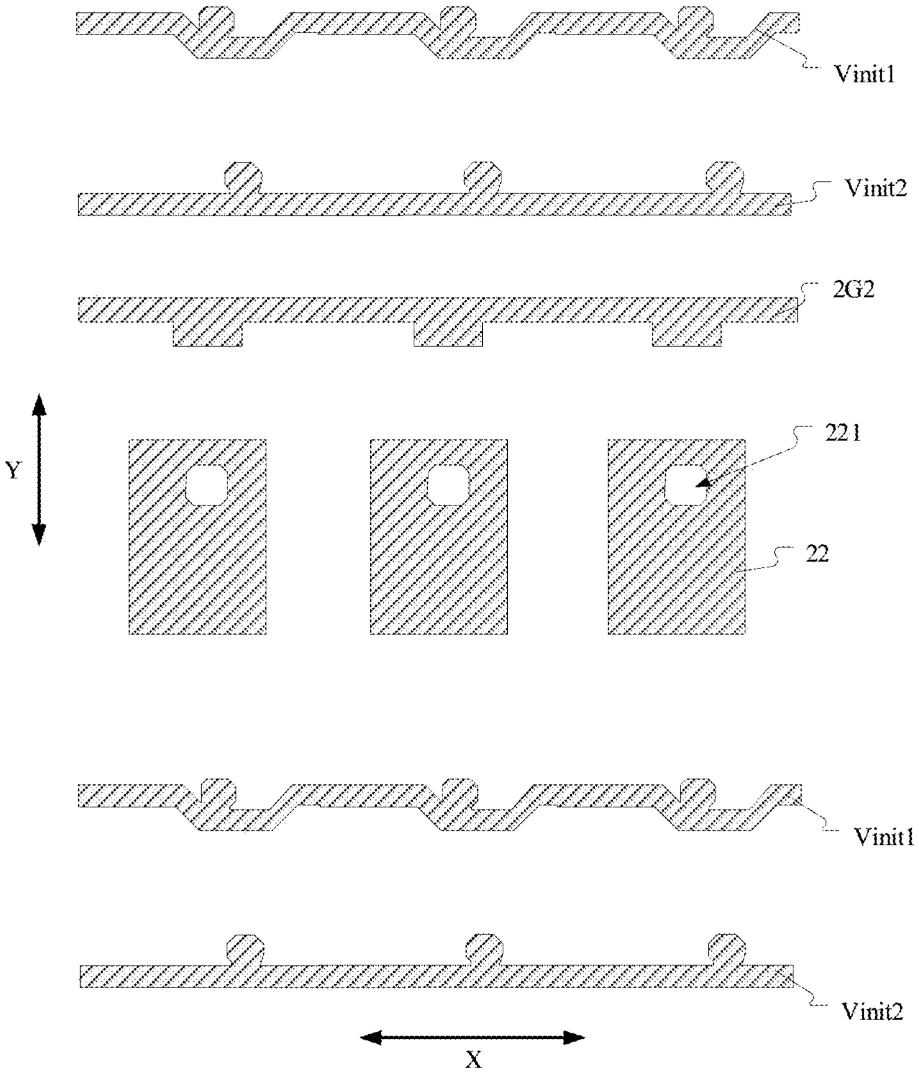
FIG. 7 is a structural layout of a second conductive layer in FIG. 3.
Figure 8:
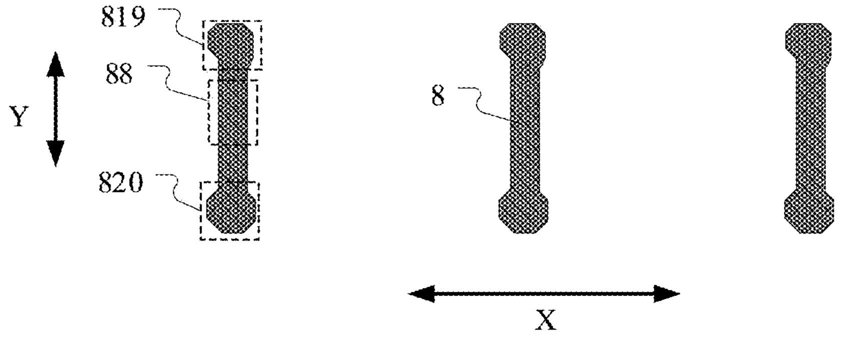
FIG. 8 is a structural layout of a second active layer in FIG. 3.
Figure 9:
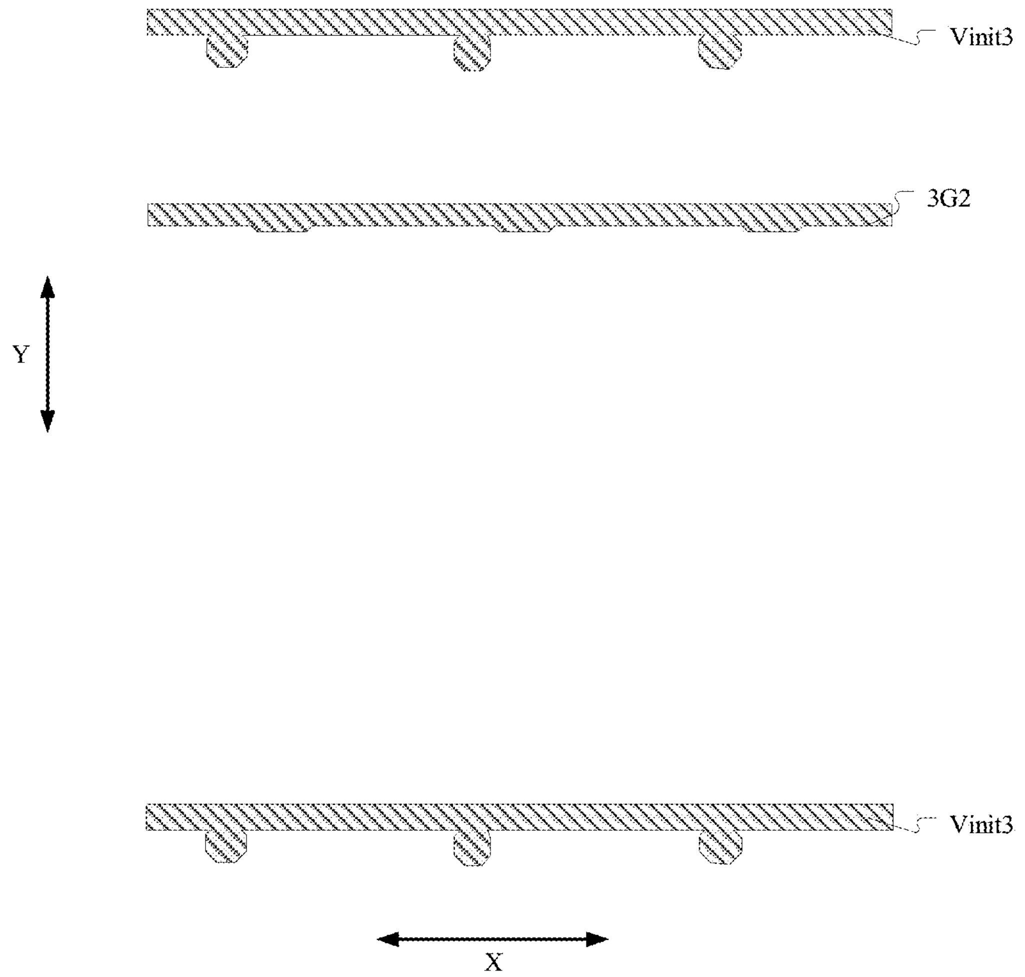
FIG. 9 is a structural layout of a third conductive layer in FIG. 3.
Figure 10:
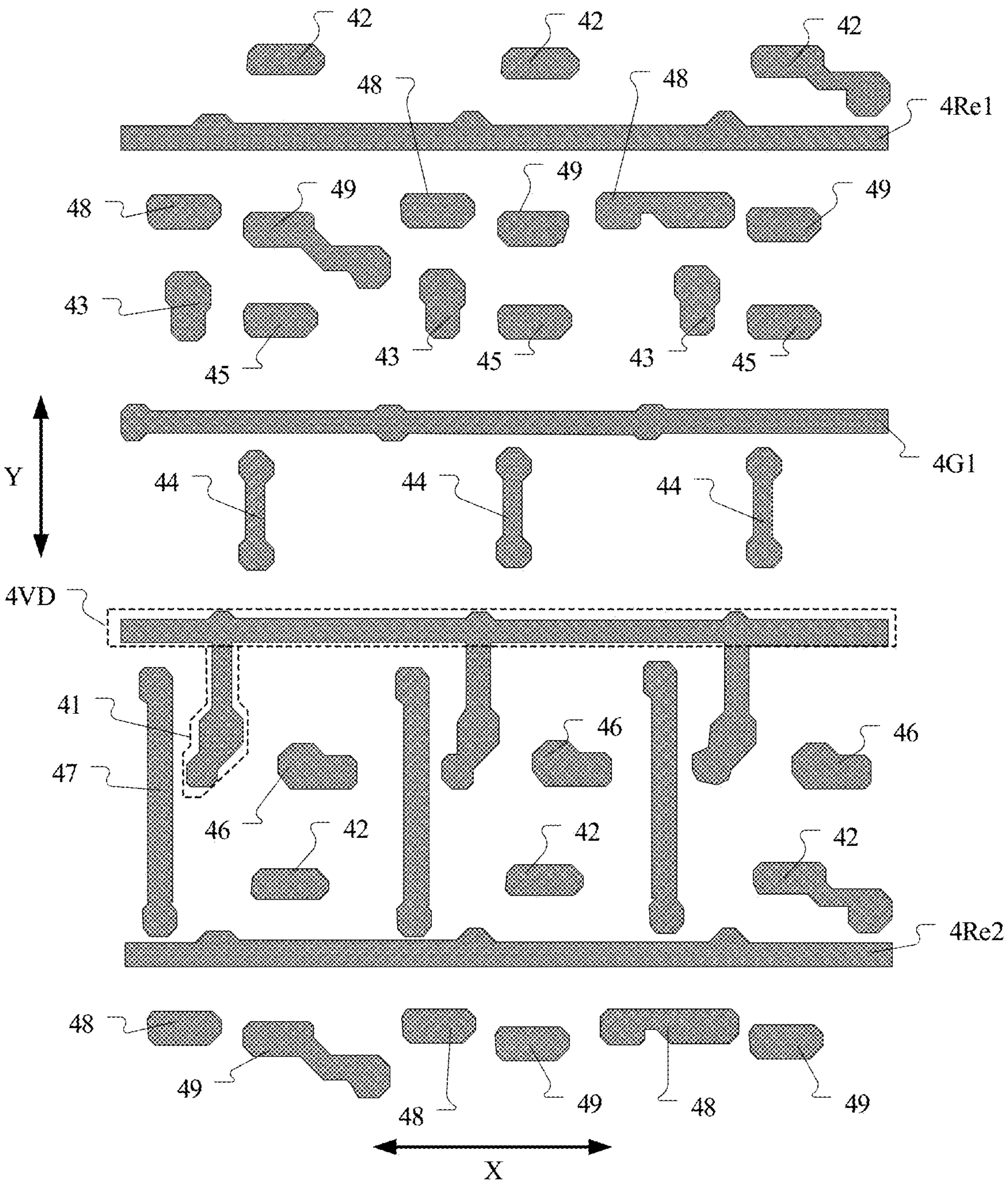
FIG. 10 is a structural layout of a fourth conductive layer in FIG. 3.
Figure 11:
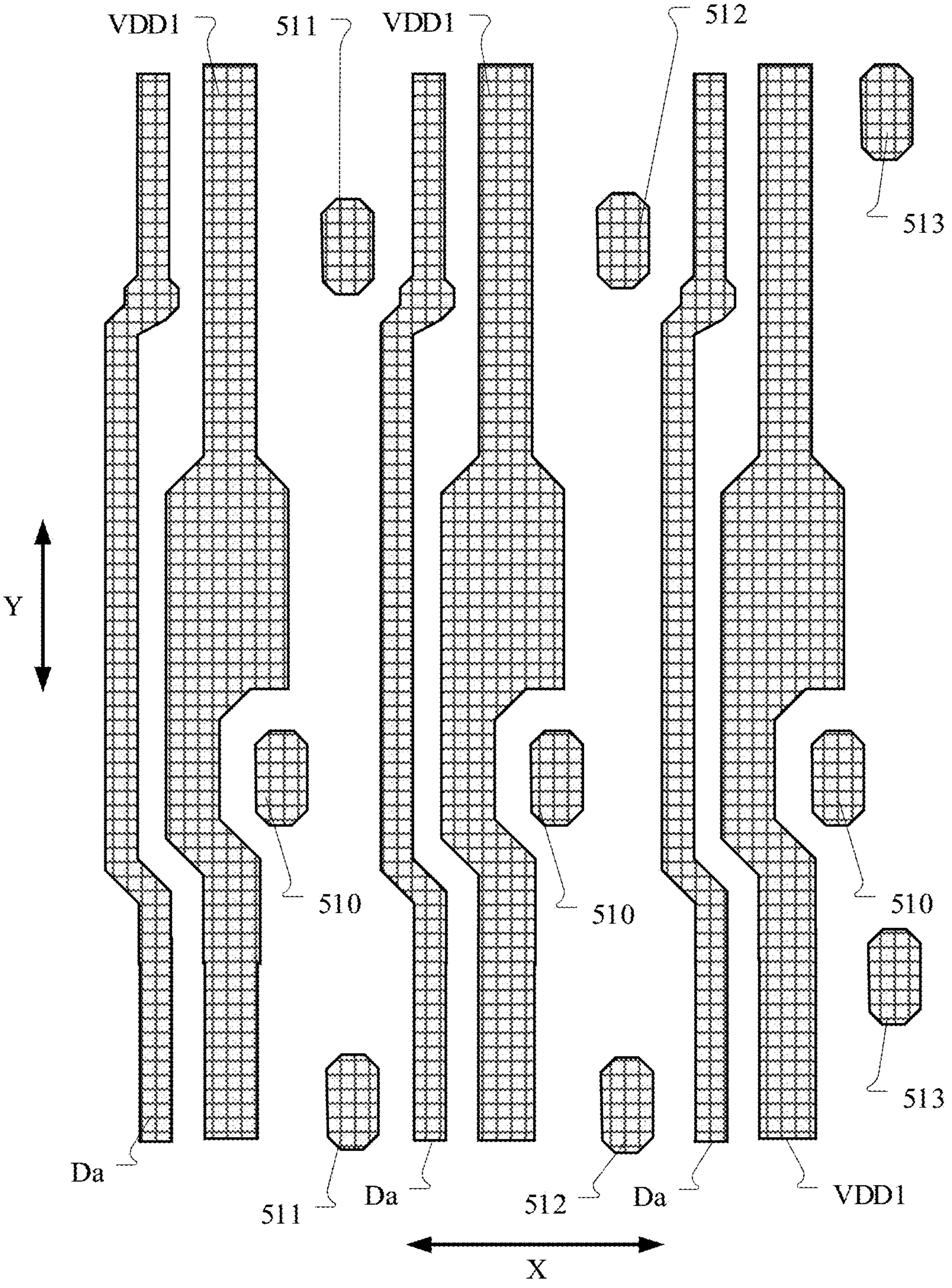
FIG. 11 is a structural layout of a fifth conductive layer in FIG. 3.
Figure 12:
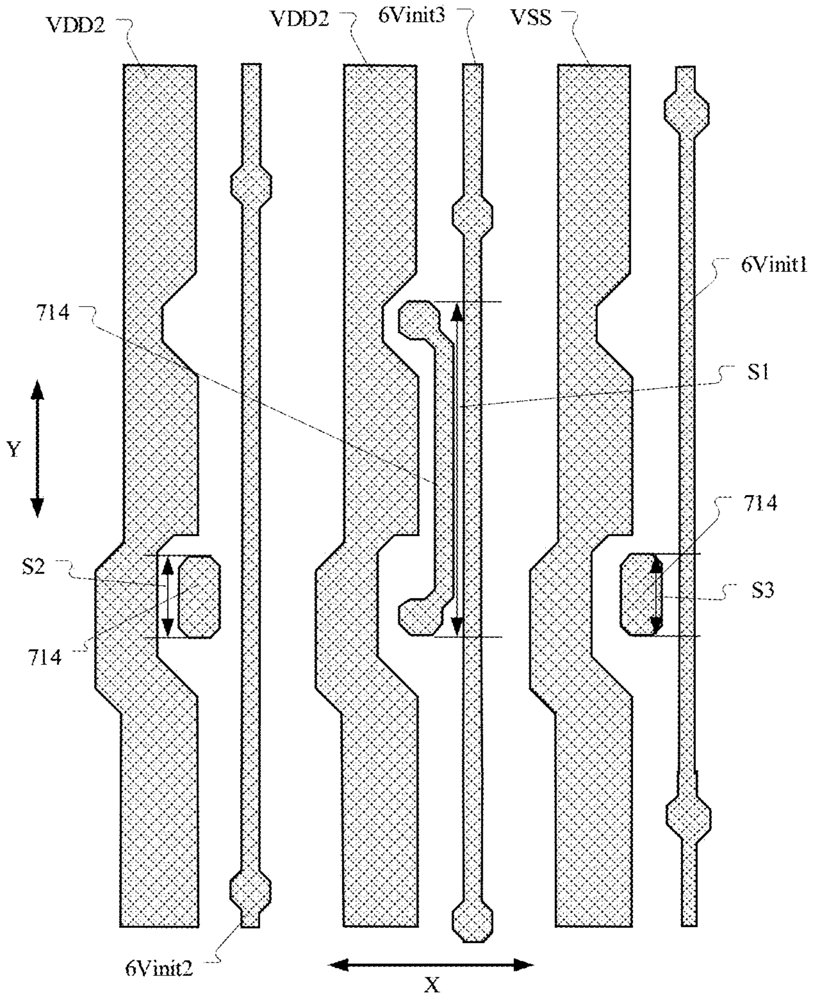
FIG. 12 is a structural layout of a sixth conductive layer in FIG. 3.
Figure 13:
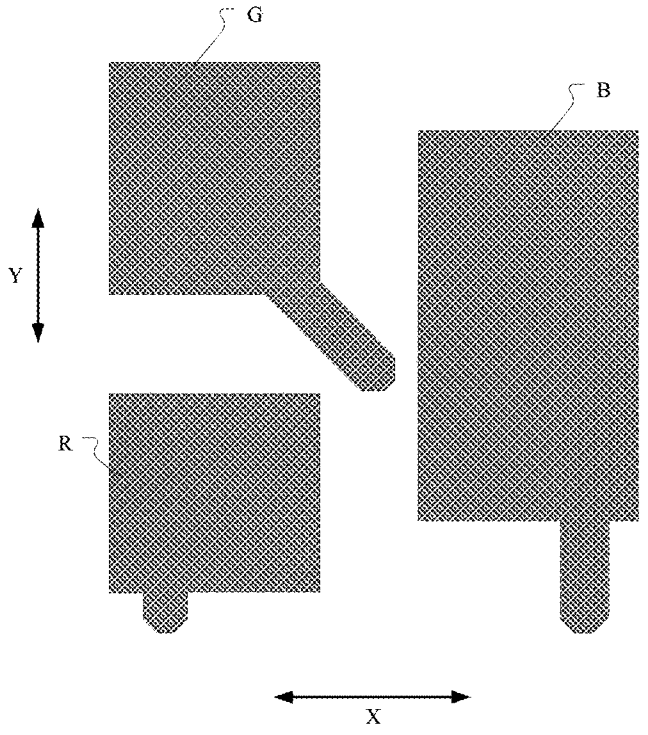
FIG. 13 is a structural layout of an electrode layer in FIG. 3.
Figure 14:
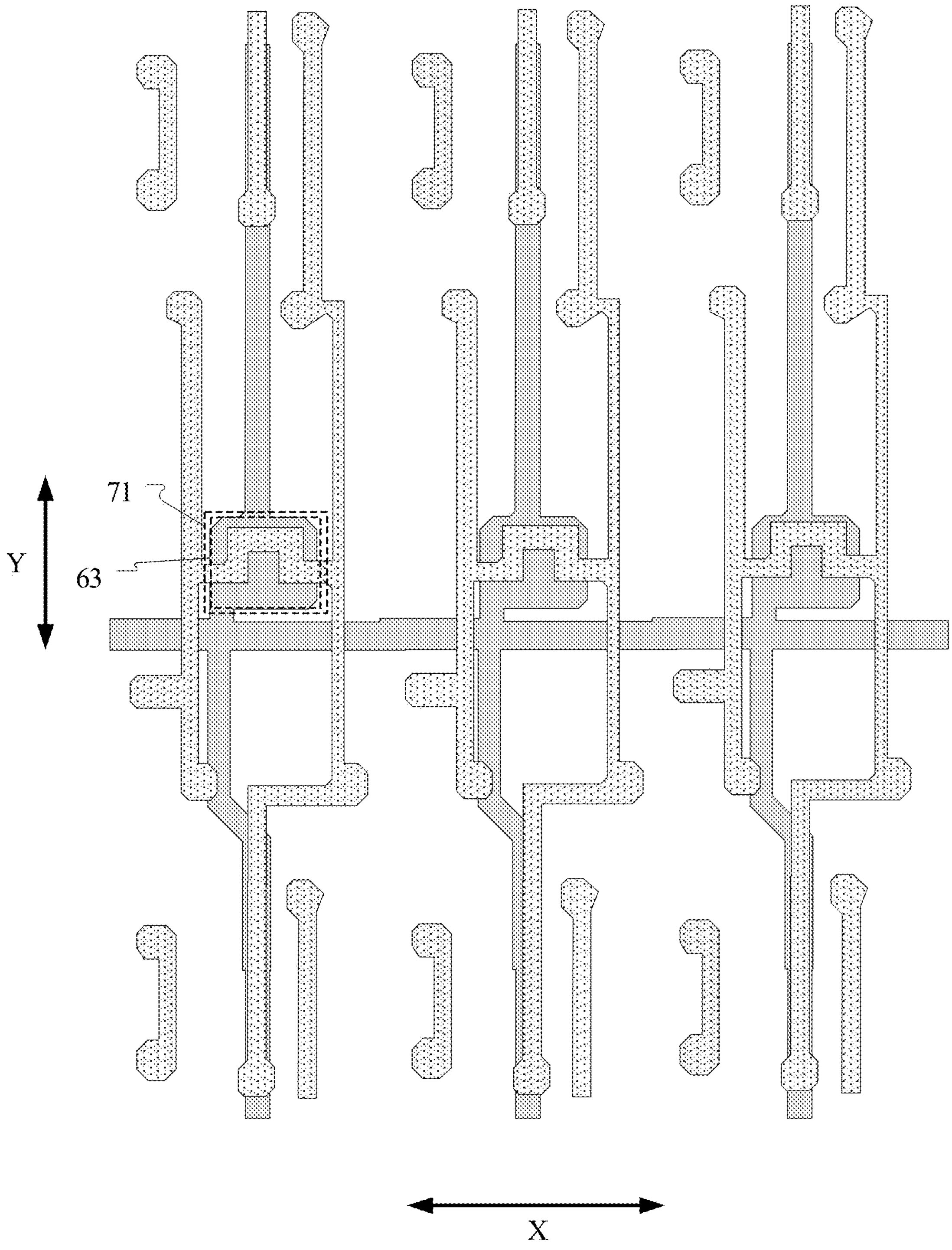
FIG. 14 is a structural layout of a shielding layer and a first active layer in FIG. 3.
Figure 15:
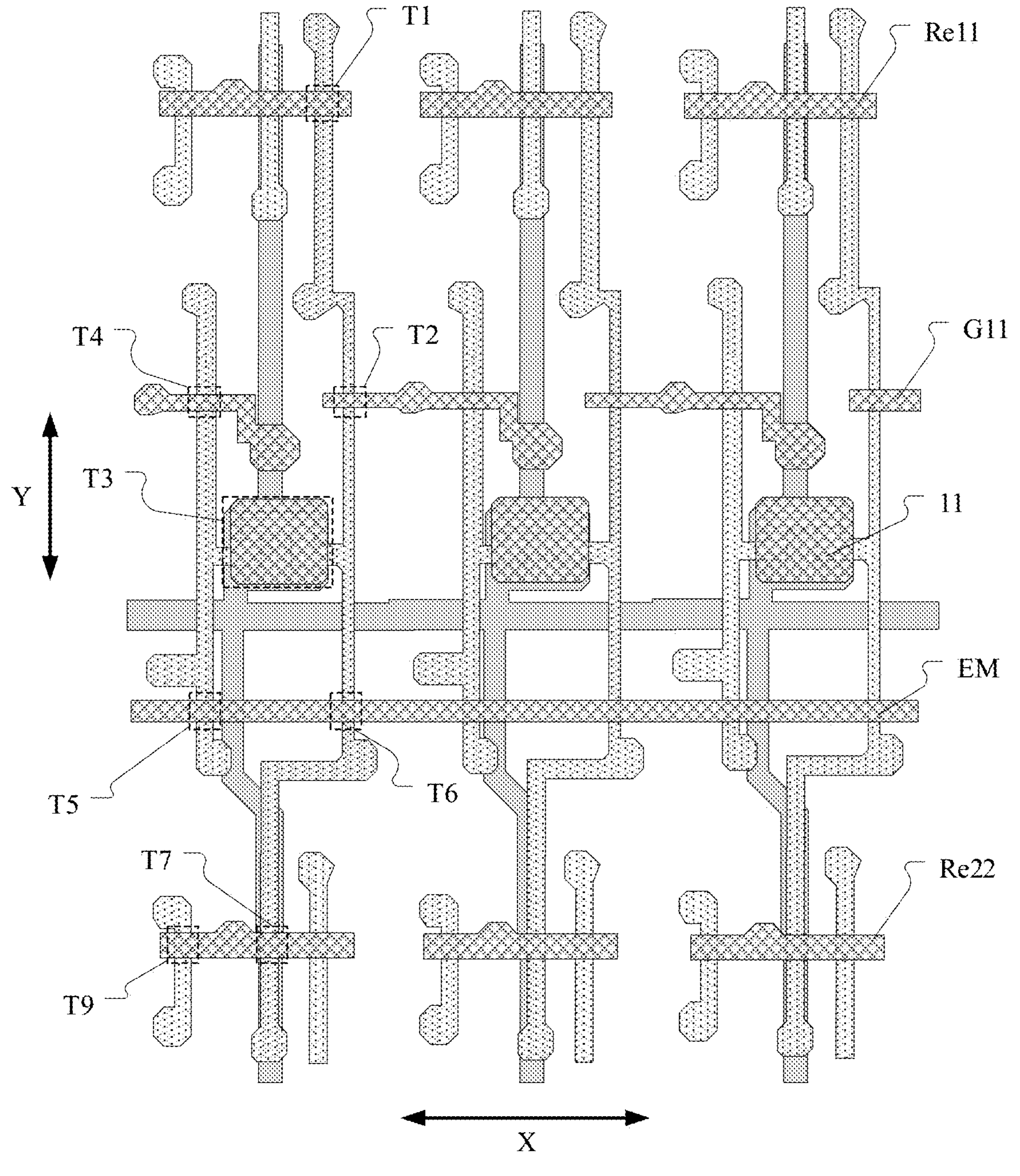
FIG. 15 is a structural layout of a shielding layer, a first active layer, and a first conductive layer in FIG. 3.
Figure 16:
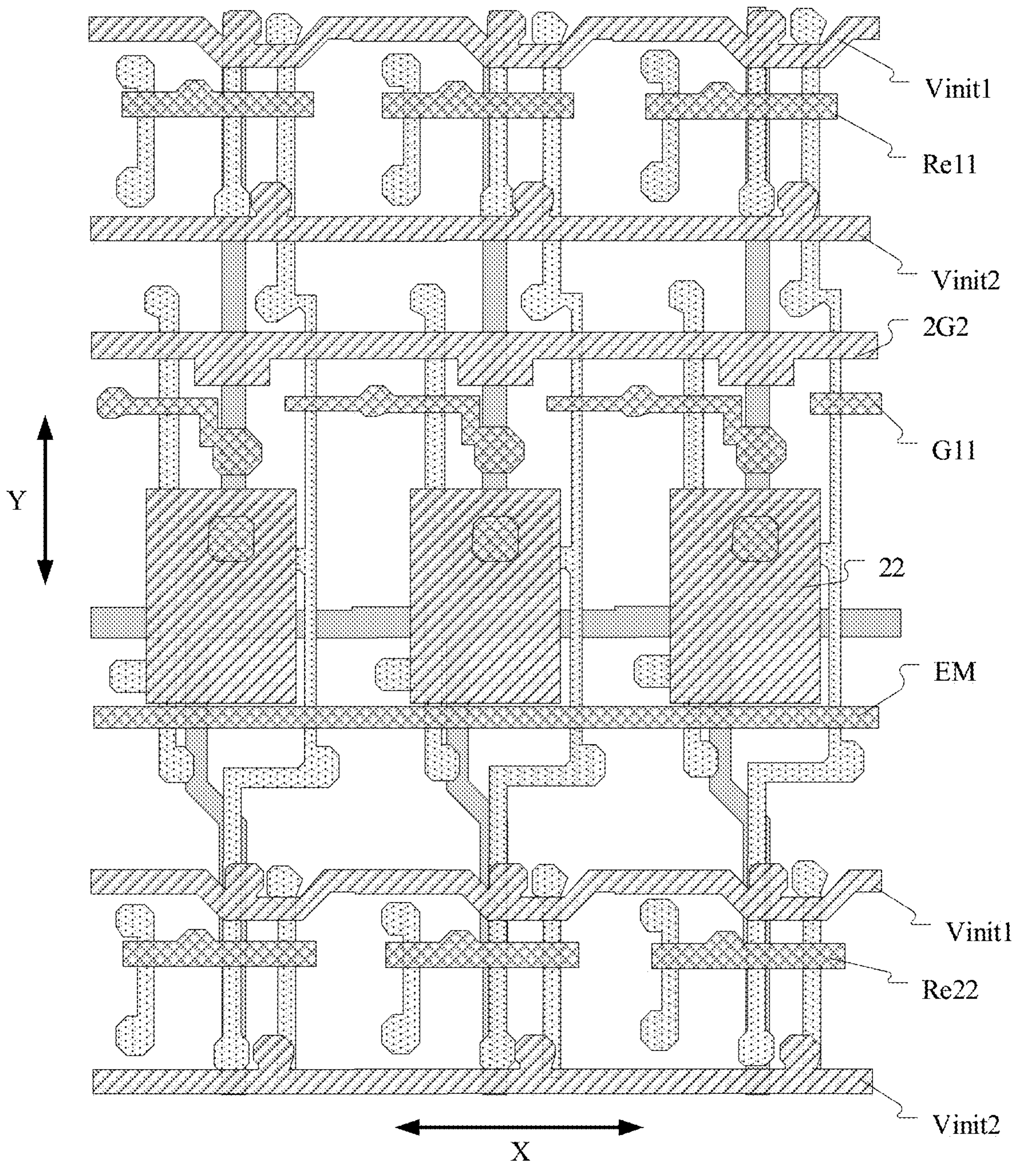
FIG. 16 is a structural layout of a shielding layer, a first active layer, a first conductive layer, and a second conductive layer in FIG. 3.
Figure 17:
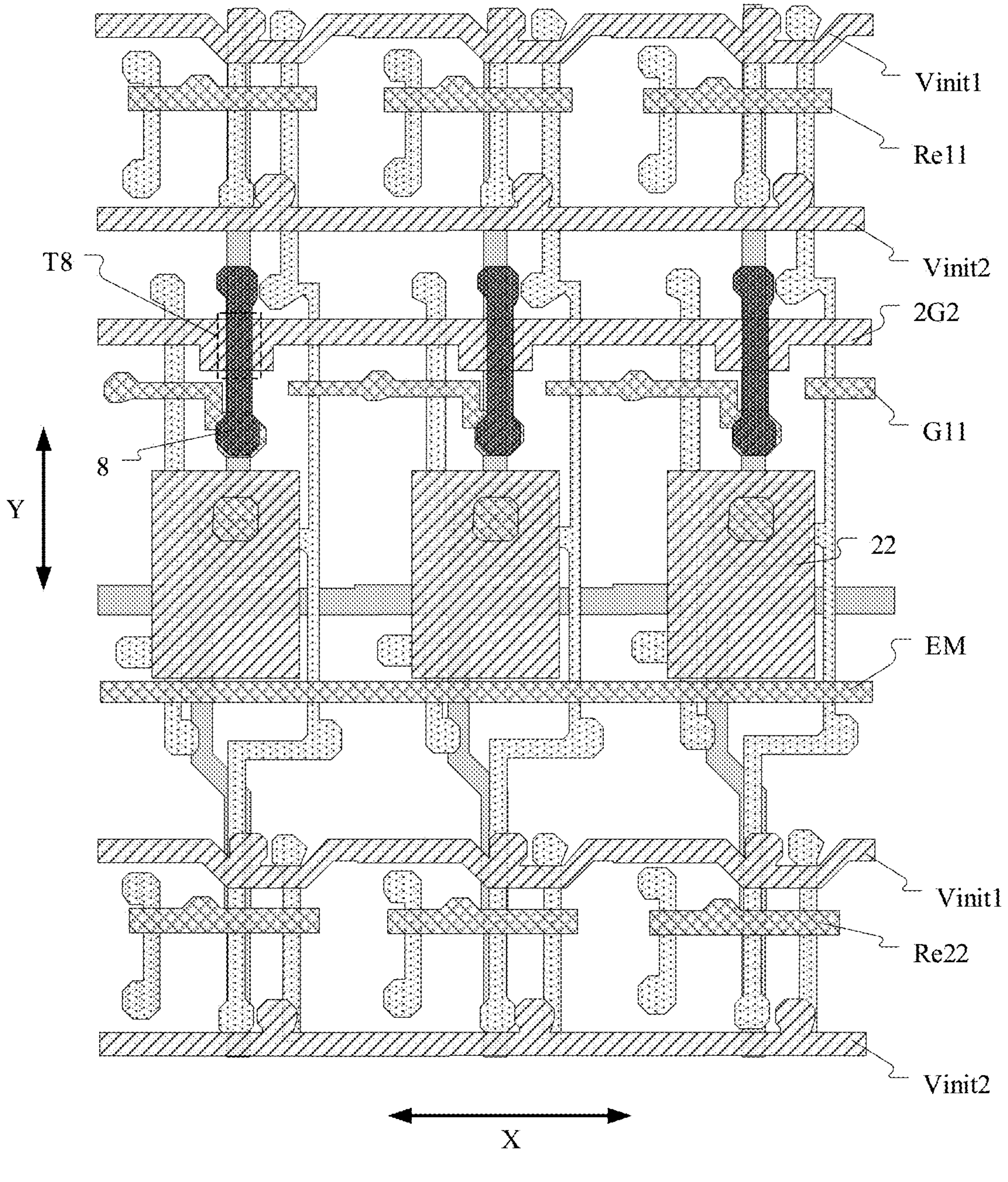
FIG. 17 is a structural layout of a shielding layer, a first active layer, a first conductive layer, a second conductive layer, and a second active layer in FIG. 3.
Figure 18:
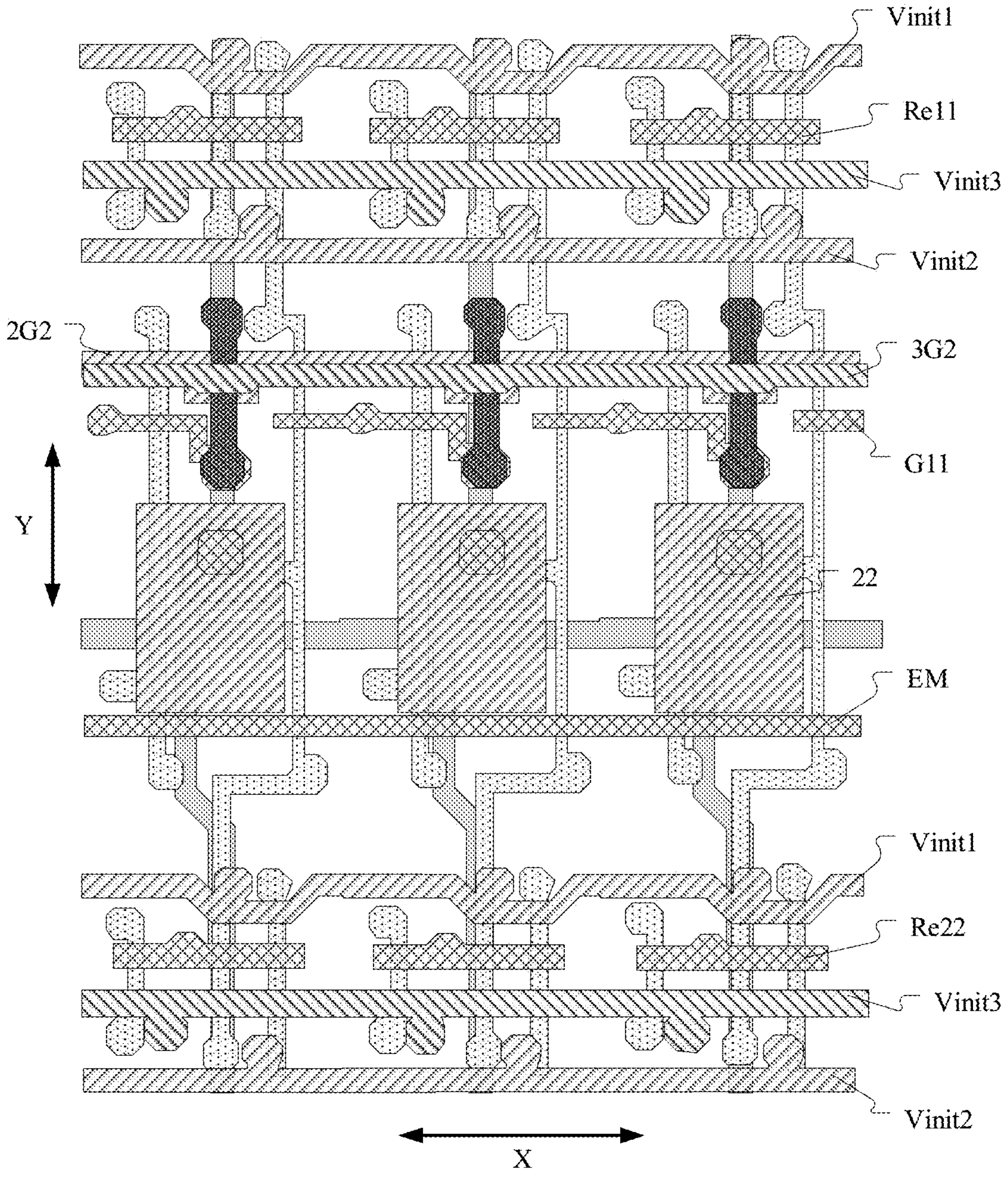
FIG. 18 is a structural layout of a shielding layer, a first active layer, a first conductive layer, a second conductive layer, a second active layer, and a third conductive layer in FIG. 3.
Figure 19:
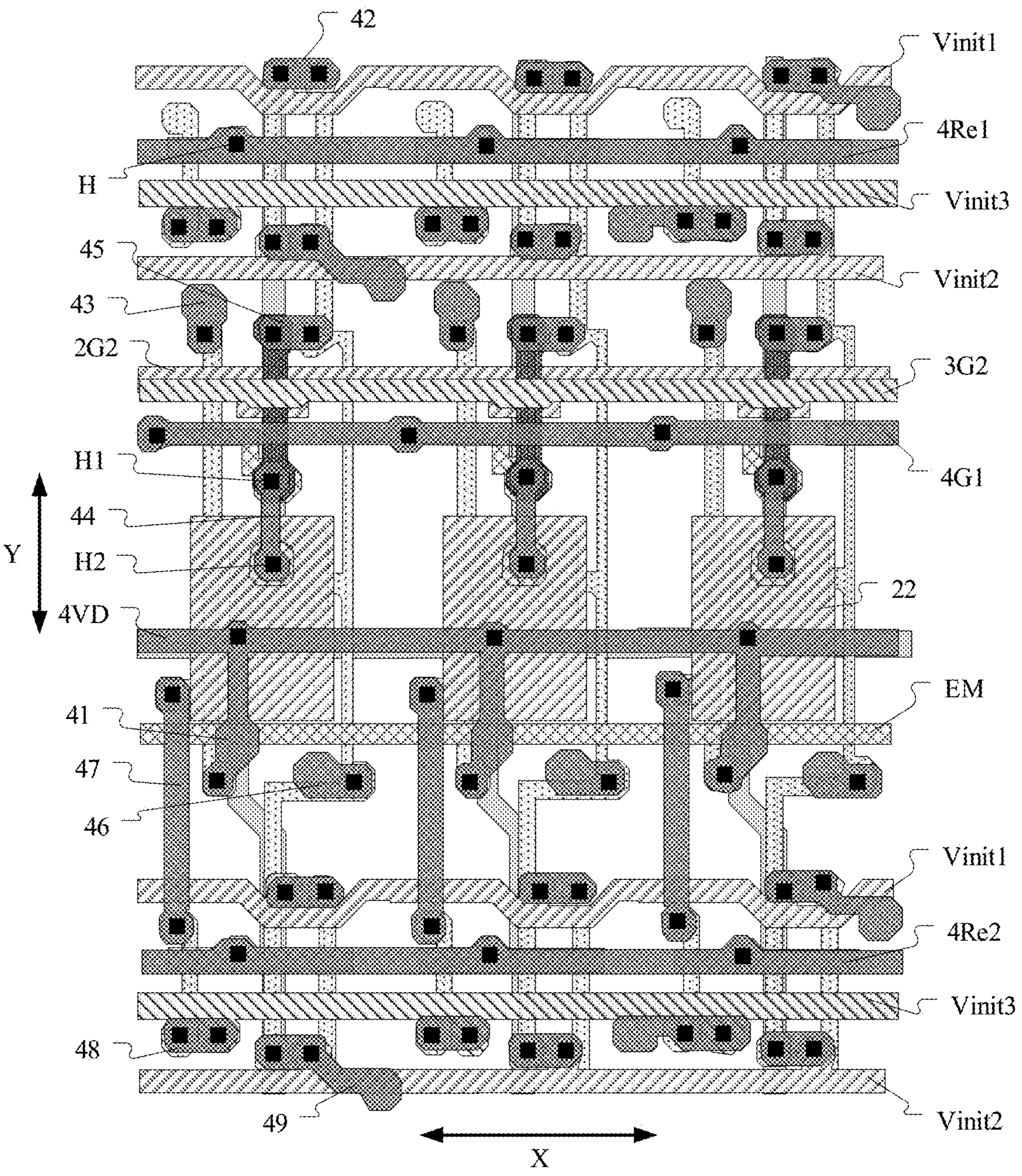
FIG. 19 is a structural layout of a shielding layer, a first active layer, a first conductive layer, a second conductive layer, a second active layer, a third conductive layer, and a fourth conductive layer in FIG. 3.
Figure 20:
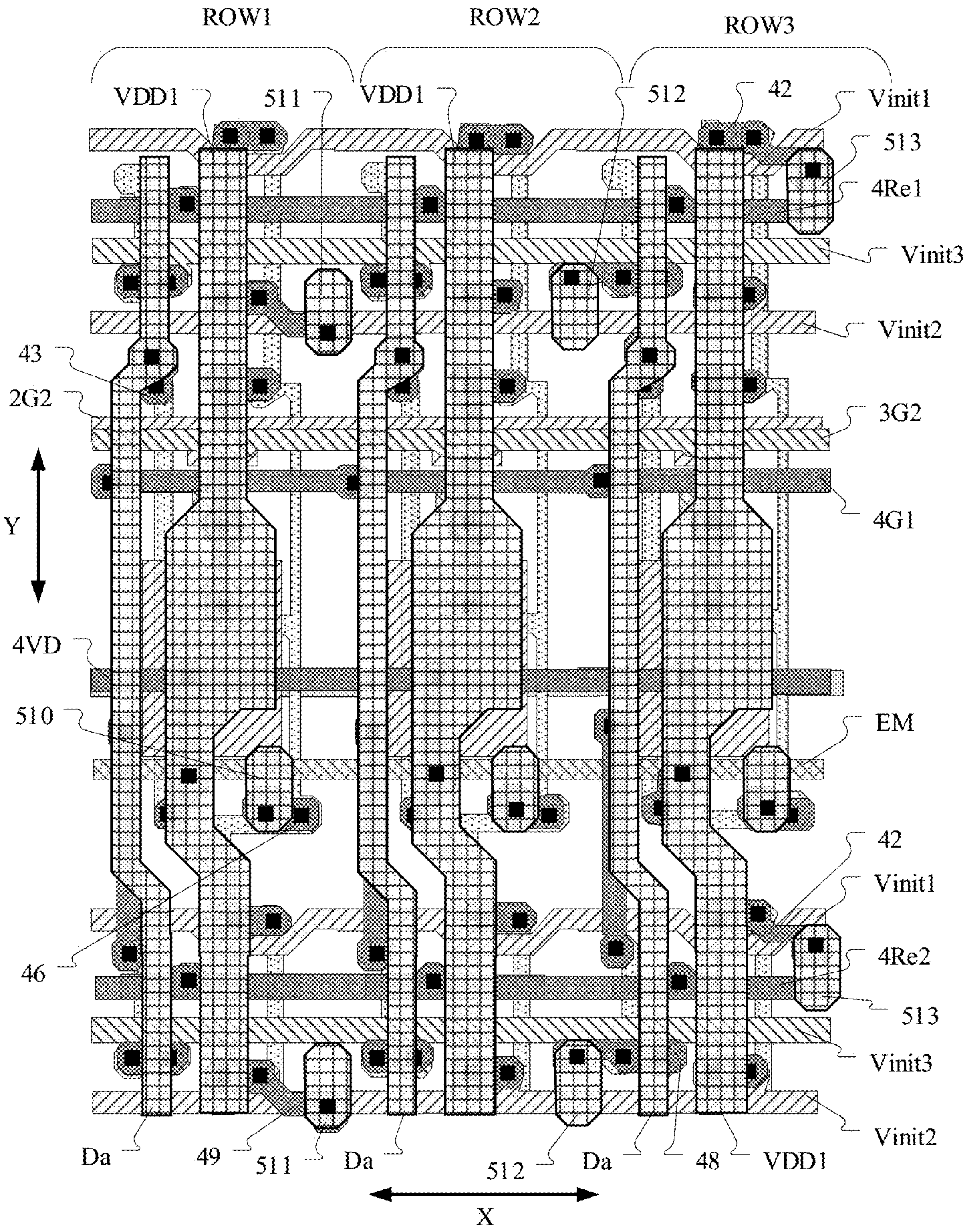
FIG. 20 is a structural layout of a shielding layer, a first active layer, a first conductive layer, a second conductive layer, a second active layer, a third conductive layer, a fourth conductive layer, and a fifth conductive layer in FIG. 3.
Figure 21:
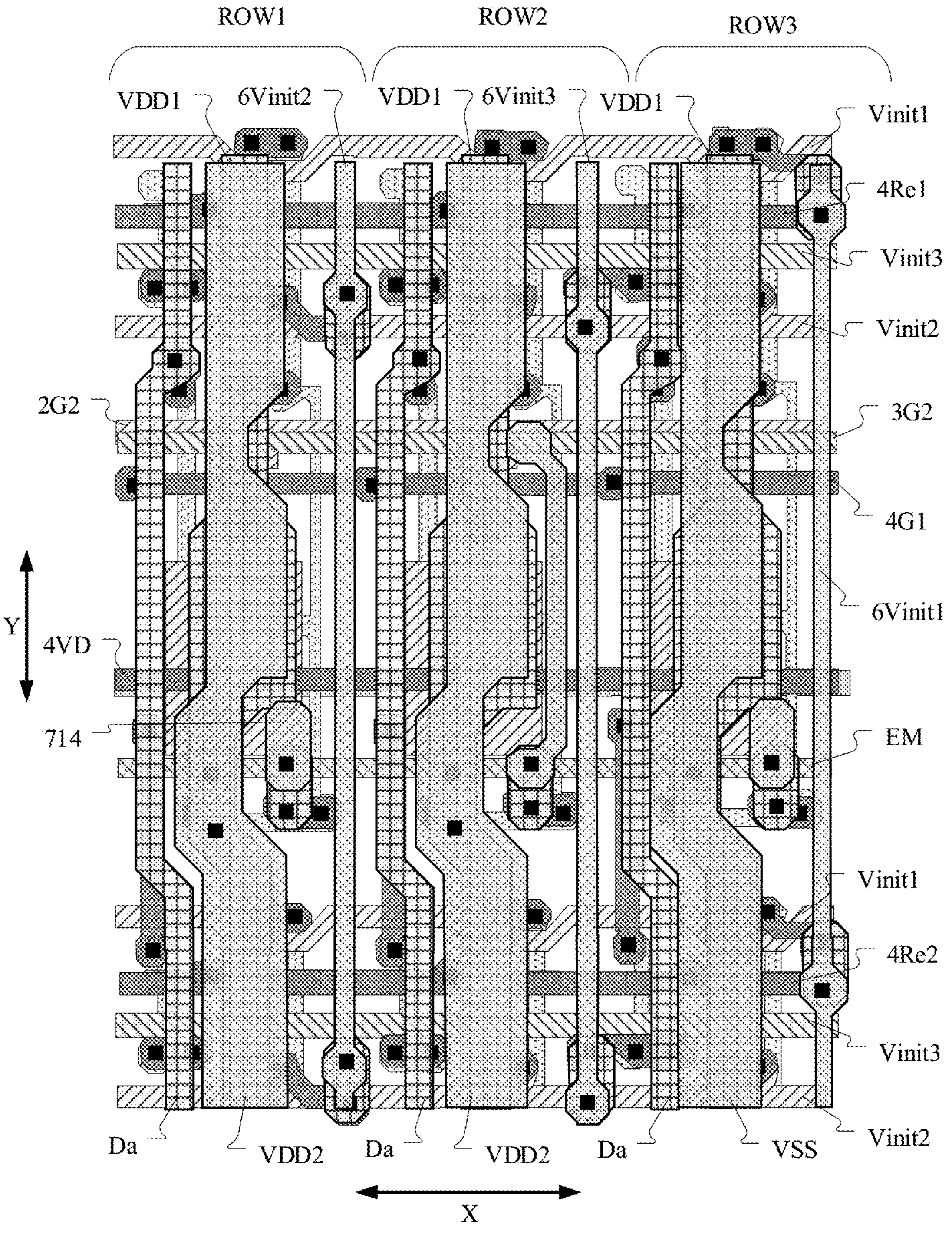
FIG. 21 is a structural layout of a shielding layer, a first active layer, a first conductive layer, a second conductive layer, a second active layer, a third conductive layer, a fourth conductive layer, a fifth conductive layer, and a sixth conductive layer in FIG. 3.

An exemplary embodiment also provides a display panel, which may include a base substrate, a shielding layer, a first active layer, a first conductive layer, a second conductive layer, a second active layer, a third conductive layer, a fourth conductive layer, a fifth conductive layer, a sixth conductive layer, and an electrode layer which are stacked in that order. An insulating layer may be provided between any adjacent layers described above. As shown in FIGS. 3-21, FIG. 3 is a structural layout of a display panel according to an exemplary embodiment of the present disclosure, FIG. 4 is a structural layout of a shielding layer in FIG. 3, FIG. 5 is a structural layout of a first active layer in FIG. 3, FIG. 6 is a structural layout of a first conductive layer in FIG. 3, FIG. 7 is a structural layout of a second conductive layer in FIG. 3, FIG. 8 is a structural layout of a second active layer in FIG. 3, FIG. 9 is a structural layout of a third conductive layer in FIG. 3, FIG. 10 is a structural layout of a fourth conductive layer in FIG. 3, FIG. 11 is a structural layout of a fifth conductive layer in FIG. 3, FIG. 12 is a structural layout of a sixth conductive layer in FIG. 3, FIG. 13 is a structural layout of an electrode layer in FIG. 3, FIG. 14 is a structural layout of the shielding layer and the first active layer in FIG. 3, FIG. 15 is a structural layout of the shielding layer, the first active layer, and the first conductive layer in FIG. 3, FIG. 16 is a structural layout of the shielding layer, the first active layer, the first conductive layer, and the second conductive layer in FIG. 3, FIG. 17 is a structural layout of the shielding layer, the first active layer, the first conductive layer, the second conductive layer, and the second active layer in FIG. 3, FIG. 18 is a structural layout of the shielding layer, the first active layer, the first conductive layer, the second conductive layer, the second active layer, and the third conductive layer in FIG. 3, FIG. 19 is a structural layout of the shielding layer, the first active layer, the first conductive layer, the second conductive layer, the second active layer, the third conductive layer, and the fourth conductive layer in FIG. 3, FIG. 20 is a structural layout of the shielding layer, the first active layer, the first conductive layer, the second conductive layer, the second active layer, the third conductive layer, the fourth conductive layer, and the fifth conductive layer in FIG. 3, and FIG. 21 is a structural layout of the shielding layer, the first active layer, the first conductive layer, the second conductive layer, the second active layer, the third conductive layer, the fourth conductive layer, the fifth conductive layer, and the sixth conductive layer in FIG. 3. The display panel may include a plurality of pixel driving circuits shown in FIG. 1.

As shown in FIGS. 3, 4, and 14, the shielding layer may include a plurality of shielding parts 71, and the adjacent shielding parts 71 may be connected to each other.

As shown in FIGS. 3, 5, 14, 15, the first active layer may include a first active part 61, a second active part 62, a third active part 63, a fourth active part 64, a fifth active part 65, a sixth active part 66, a seventh active part 67, and a ninth active part 69. The first active part 61 is used to form a channel region of the first transistor T1, the second active part 62 is used to form a channel region of the second transistor T2, the third active part 63 is used to form a channel region of the driving transistor T3, the fourth active part 64 is used to form a channel region of the fourth transistor T4, the fifth active part 65 is used to form a channel region of the fifth transistor T5, the sixth active part 66 is used to form a channel region of the sixth transistor T6, the seventh active part 67 is used to form a channel region of the seventh transistor T7, and the ninth active part 69 is used to form a channel region of the ninth transistor T9. In addition, the first active layer may further include a tenth active part 610, an eleventh active part 611, a twelfth active part 612, a thirteenth active part 613, a fourteenth active part 614, a fifteenth active part 615, a sixteenth active part 616, a seventeenth active part 617, and an eighteenth active part 618. The tenth active part 610 is connected to an end of fourth active part 64 away from the third active part 63, the eleventh source portion 611 is connected between the first active part 61 and the second active part 62, the twelfth active part 612 is connected between the third active part 63 and the fifth active part 65, the thirteenth source portion 613 is connected to an end of the fifth active part 65 away from the third active part 63, and the fourteenth active part 614 is connected between the sixth active part 66 and the seventh active part 67, the fifteenth active part 615 and the sixteenth active part 616 are connected to two ends of the ninth active part 69, the seventeenth active part 617 is connected to an end of the seventh active part 67 away from the sixth active part 66, and the eighteenth active part 618 is connected to an end of the first active part 61 away from the second active part 62.

An orthographic projection of the shielding part 71 on the base substrate may cover an orthographic projection of the third active part 63 on the base substrate, and the shielding part 71 may shield the third active part 63 from light to reduce the effect of light on the driving characteristics of the driving transistor T3. In addition, the shielding layer may also be connected to a stable voltage source for noise shielding of the driving transistor T3, for example, the shielding layer may be connected to the first power supply terminal VDD, the first initial signal terminal Vinit1, the second initial signal terminal Vinit2, the third initial signal terminal Vinit3, and the like. The first active layer may be formed from a polysilicon material, and accordingly, the first transistor T1, the second transistor T2, the driving transistor T3, the fourth transistor T4, the fifth transistor T5, the sixth transistor T6, the seventh transistor T7, and the ninth transistor T9 may be a low-temperature polycrystalline silicon thin-film transistor of the P-type.

As shown in FIGS. 3, 6, and 15, the first conductive layer may include the first reset signal line Re1, the first gate line G1, the enable signal line EM, the second reset signal line Re2, and a first conductive part 11. The first reset signal line Re1 may be used to provide the first reset signal terminal of FIG. 1. The first reset signal line Re1 may include a plurality of first reset signal line sections Re11. Orthographic projections, on the base substrate, of the first reset signal line sections Re11 in the same first reset signal line Re1 may extend along a first direction X and be spaced apart along the first direction X. The orthographic projection of the first reset signal line section Re11 on the base substrate may cover an orthographic projection of the first active part 61 on the base substrate, and a portion of the first reset signal line section Re11 may be used to form the gate electrode of the first transistor T1. The first gate line G1 may be used to provide the first gate driving signal terminal in FIG. 1, and the first gate line G1 may include a plurality of first gate line sections G11. Orthographic projections, on the base substrate, of the plurality of first gate line sections G11 in the same first gate line G1 may extend along the first direction X and be spaced apart along the first direction X. The orthographic projection of the first gate line section G11 on the base substrate may cover the orthographic projection of the second active part 62 on the base substrate, and the orthographic projection of the fourth active part 64 on the base substrate. A portion of the first gate line section G11 may be used to form the gate electrode of the second transistor T2, and another portion of the first gate line section G11 may be used to form the gate electrode of the fourth transistor T4. The enable signal line EM is used to provide the enable signal terminal in FIG. 1, and an orthographic projection of the enable signal line EM on the base substrate may extend along the first direction X and covers an orthographic projection of the fifth active part 65 on the base substrate and an orthographic projection of the sixth active part 66 on the base substrate. A portion of the enable signal line EM may be used to form the gate electrode of the fifth transistor T5, and another portion of the enable signal line EM may be used to form the gate electrode of the sixth transistor T6. The second reset signal line Re2 is used to provide the second reset signal terminal in FIG. 1, and the second reset signal line Re2 may include a plurality of second reset signal line sections Re22. Orthographic projections, on the base substrate, of the second reset signal line sections Re22 may extend along the first direction X and be spaced apart along the first direction. The orthographic projection of the second reset signal line section Re22 on the base substrate may cover an orthographic projection of the seventh active part 67 on the base substrate, and an orthographic projection of the ninth active part 69 on the base substrate. A portion of the second reset signal line section Re22 may be used to form the gate electrode of the seventh transistor T7, and another portion of the second reset signal line section Re22 may be used to form the gate electrode of the ninth transistor. An orthographic projection of the first conductive part 11 on the base substrate may cover an orthographic projection of the third active part 63 on the base substrate, and the first conductive part 11 may be used to form the gate electrode of the driving transistor T3 and the first electrode of the capacitor C.

As shown in FIGS. 3, 6, and 15, the first reset signal line Re1 in the pixel driving circuit in a current row may be reused as the second reset signal line Re2 in the pixel driving circuit in an adjacent previous row, which arrangement may reduce the size of the pixel driving circuit in the second direction Y. The second direction Y and the first direction X may be intersected with each other, for example, the first direction X may be a row direction and the second direction Y may be a column direction. In addition, the display panel may perform a conducting treatment on the first active layer using the first conductive layer as a mask, i.e., a region in the first active layer covered by the first conductive layer may form a channel region of a transistor, and a region in the first active layer not covered by the first conductive layer forms a conductive structure.

As shown in FIGS. 3, 7, 16, the second conductive layer may include the third gate line 2G2, the first initial signal line Vinit1, the second initial signal line Vinit2, and a second conductive part 22. An orthographic projection of the first initial signal line Vinit1 on the base substrate, an orthographic projection of the second initial signal line Vinit2 on the base substrate, and an orthographic projection of the third gate line 2G2 on the base substrate all may extend along the first direction X. The first initial signal line Vinit1 is used to provide the first initial signal terminal in FIG. 1, the second initial signal line Vinit2 is used to provide the second initial signal terminal in FIG. 1, and the third gate line 2G2 is used to provide the second gate driving signal terminal in FIG. 1. An orthographic projection of the second conductive part 22 on the base substrate may be overlapped with the orthographic projection of the first conductive part 11 on the base substrate, and the second conductive part 22 may be used to form the second electrode of the capacitor C. As shown in FIGS. 3, 7, 16, an orthographic projection, on the base substrate, of the second initial signal line Vinit2 in the pixel driving circuit in an adjacent previous row may be located between an orthographic projection, on the base substrate, of the third gate line 2G2 in the pixel driving circuit in a current row and the orthographic projection, on the base substrate, of the first reset signal line Re1 in the pixel driving circuit in the current row, which arrangement may further reduce the size of the pixel driving circuit in the second direction Y.

As shown in FIGS. 3, 8, and 17, the second active layer may include a plurality of sub-active parts 8, the sub-active parts 8 includes an eighth active part 88, a nineteenth active part 819, and a twentieth active part 820, the eighth active part 88 is connected between the nineteenth active part 819 and the twentieth active part 820, and the eighth active part 88 is used to form a channel region of the eighth transistor. The orthographic projection of the third gate line 2G2 on the base substrate may cover an orthographic projection of the eighth active part 88 on the base substrate, and a portion of the third gate line 2G2 may be used to form a bottom gate of the eighth transistor T8. The second active layer may be formed from indium gallium zinc oxide, and accordingly, the eighth transistor T8 may be an N-type metal oxide thin film transistor.

As shown in FIGS. 3, 9, and 18, the third conductive layer may include the second gate line 3G2 and the third initial signal line Vinit3, and an orthographic projection of the second gate line 3G2 on the base substrate and an orthographic projection of the third initial signal line Vinit3 on the base substrate may extend along the first direction X. The second gate line 3G2 is used to provide the second gate driving signal terminal in FIG. 1, the orthographic projection of the second gate line 3G2 on the base substrate may cover an orthographic projection of the eighth active part 88 on the base substrate, and a portion of the second gate line 3G2 may be used to form a top gate of the eighth transistor T8. The second gate line 3G2 and the third gate line 2G2 in the pixel driving circuit in the same row may be connected through a via hole, and the via hole connected between the second gate line 3G2 and the third gate line 2G2 may be located in an edge wiring area outside the display area of the display panel. The third initial signal line Vinit3 may be used to provide the third initial signal terminal in FIG. 1. In an exemplary embodiment, the orthographic projection, on the base substrate, of the third initial signal line Vinit3 in the pixel driving circuit in an adjacent previous row may be located between the orthographic projection, on the base substrate, of the second initial signal line Vinit2 in the pixel driving circuit in the adjacent previous row and the orthographic projection, on the base substrate, of the first reset signal line Re1 in the pixel driving circuit in the current row, which arrangement may further reduce the size of the pixel driving circuit in the second direction Y. In addition, the display panel may perform a conducting treatment on the second active layer using the third conductive layer as a mask, i.e., a region of the second active layer covered by the third conductive layer may form a channel region of a transistor, and a region of the second active layer not covered by the third conductive layer forms a conductive structure.

As shown in FIGS. 3, 10, 19, the fourth conductive layer may include a first reset connection line 4Re1, a second reset connection line 4Re2, a first gate connection line 4G1, a power connection line 4VD, a first bridging part 41, a second bridging part 42, a third bridging part 43, a fourth bridging part 44, a fifth bridging part 45, a sixth bridging part 46, a seventh bridging part 47, an eighth bridging part 48 and a ninth bridging part 49. An orthographic projection of the first reset connection line 4Re1 on the base substrate, an orthographic projection of the second reset connection line 4Re2 on the base substrate, an orthographic projection of the first gate connection line 4G1 on the base substrate, and an orthographic projection of the power connection line 4VD on the base substrate may all extend along the first direction X. The first reset connection line 4Re1 may be connected to a plurality of first reset signal line sections Re11 in a same first reset signal line Re1 respectively through via holes H. The black square indicates the position of the via hole. The second reset connection line 4Re2 may be connected to a plurality of second reset signal line sections Re22 in a same second reset signal line Re2 respectively through via holes. The first gate connection line 4G1 may be connected to a plurality of first gate line sections G11 in a same first gate line G1 respectively through via holes. In an exemplary embodiment, the square resistance of the first conductive layer is greater than the square resistance of the fourth conductive layer. In an exemplary embodiment, the first reset signal line sections Re11 are bridged through the first reset connection line 4Re1 in the fourth conductive layer, which may reduce the resistance of the reset signal line connected to the first transistor T1 and thus improve the response speed of the first transistor T1, and in addition, this arrangement can reduce the difference in conductions of the first transistors T1 at different positions of the display panel, and thus improve the display uniformity of the display panel. Similarly, the second reset connection line 4Re2 may improve the response speed of the seventh transistor T7 and the ninth transistor T9, as well as improve the display uniformity of the display panel, and the first gate connection line 4G1 may improve the response speed of the second transistor T2 and the fourth transistor T4, as well as improve the display uniformity of the display panel. The first bridging part 41 is connected to the power connection line 4VD and is connected to the thirteenth active part 613 through a via hole, and the power connection line 4VD is connected to a plurality of second conductive parts 22 arranged in the first direction X through via holes to connect the first electrode of the fifth transistor and the second electrode of the capacitor. The second bridging part 42 may be connected to the eighteenth active part 618 and the first initial signal line Vinit1 respectively through via holes to connect the first electrode of the first transistor T1 and the first initial signal terminal. The third bridging part 43 may be connected to the tenth active part 610 through a via hole to connect to the first electrode of the fourth transistor T4. The fourth bridging part 44 may be connected to the twentieth active part 820 through a first via hole H1 and to the first conductive part 11 through a second via hole H2 to connect the gate electrode of the driving transistor T3 and the first electrode of the eighth transistor T8. As shown in FIG. 7, an opening 221 is formed in the second conductive part 22, and an orthographic projection of the second via hole H2 on the base substrate is within an orthographic projection of the opening 221 on the base substrate to insulate the second via hole H2 from the second conductive part 22. The fifth bridging part 45 may be connected to the nineteenth active part 819 and the eleventh active part 611 respectively through via holes to connect the second electrode of the eighth transistor T8, the second electrode of the first transistor T1 and the first electrode of the second transistor T2. The sixth bridging part 46 may be connected to the fourteenth active part 614 through a via hole to connect to the second electrode of the sixth transistor T6. The seventh bridging part 47 may be connected to the twelfth active part 612 and the fifteenth active part 615 respectively through via holes to connect the second electrode of the ninth transistor T9 and the first electrode of the driving transistor T3. The eighth bridging part 48 may be connected to the sixteenth active part 616 and the third initial signal line Vinit3 respectively through via holes to connect the first electrode of the ninth transistor T9 and the third initial signal terminal. The ninth bridging part 49 may be connected to the seventeenth active part 617 and the second initial signal line Vinit2 respectively through via holes to connect the first electrode of the seventh transistor T7 and the second initial signal terminal.

As shown in FIG. 6, the first conductive layer may also include a third conductive part 13, and the third conductive part 13 is connected to the first gate line section G11. An orthographic projection of the third conductive part 13 on the base substrate may be located at a side, facing an orthographic projection of the first conductive part 11 on the base substrate, of an orthographic projection of the first gate line section G11 on the base substrate. The orthographic projection of the third conductive part 13 on the base substrate may be overlapped with the orthographic projection of the twentieth active part 820 on the base substrate. After the data writing stage t4 is finished, the voltage on the first gate line section G11 may pull up the voltage of the third conductive part 13, and the voltage of the first conductive part electrically connected to the twentieth active part 820 is pulled up by the effect of the coupling of parasitic capacitance between the third conductive part 13 and the twentieth active part 820. This arrangement can reduce the data signal voltage of the black frame of the display panel, and thus can reduce the power consumption of the display panel. In an exemplary embodiment, the orthographic projection of the third conductive part 13 on the base substrate may be at least partially overlapped with the orthographic projection of the first via hole H1 on the base substrate, which arrangement may increase the parasitic capacitance between potential parts such as the third conductive part 13 and the first conductive part 11, thereby improving the pull-up effect of the third conductive part 13 on the gate electrode of the driving transistor.

As shown in FIGS. 3, 11, 20, the fifth conductive layer may include a data line Da, a first power line VDD1, a tenth bridging part 510, an eleventh bridging part 511, a twelfth bridging part 512, and a thirteenth bridging part 513. The data line Da may be used to provide the data signal terminal of FIG. 1, and the first power line VDD1 may be used to provide the first power supply terminal of FIG. 1. An orthographic projection of the data line Da on the base substrate and an orthographic projection of the first power line VDD1 on the base substrate may extend in the second direction Y. The data line Da may be connected to the third bridging part 43 through a via hole to connect the first electrode of the fourth transistor T4 and the data signal terminal. The first power line VDD1 may be provided corresponding to each column of the pixel driving circuits, and the first power line VDD1 may be connected to the first bridging part 41 through a via hole to connect the first power supply terminal, the second electrode of the capacitor C, and the first electrode of the fifth transistor T5. In an exemplary embodiment, the power connection line 4VD and the first power line VDD1 may form a grid structure, which has a lower resistance, thereby reducing the voltage difference between the first power supply terminals at different locations of the display panel, and thereby improving the display uniformity of the display panel. In addition, as shown in FIG. 20, the orthographic projection of the first power line VDD1 on the base substrate also covers the orthographic projection of the fourth bridging part 44 on the base substrate and the orthographic projection of the sub-active part 8 on the base substrate, and the first power line VDD1 may have a voltage stabilization function on the fourth bridging part 44 and the twentieth active part 820, so as to increase the voltage stability of the gate electrode of the driving transistor T3 in the light-emitting stage. In addition, the first power line VDD1 may also have a shielding effect on the sub-active part 8, so that the effect of light on the output characteristics of the eighth transistor T8 may be reduced. The first power line VDD1 may also be connected to the shielding layer through a via hole located in the edge wiring region to provide a stable voltage source to the shielding layer. It should be appreciated that in other exemplary embodiments, a plurality of columns of pixel driving circuits may be provided with one first power line VDD1 correspondingly, or one column of pixel driving circuits may be provided with a plurality of first power lines VDD1 correspondingly.

As shown in FIGS. 3, 11, and 20, the tenth bridging part 510 may be connected to the sixth bridging part 46 through a via hole to connect to the second electrode of the sixth transistor T6. As shown in FIG. 20, the display panel may include a first pixel driving circuit column ROW1, a second pixel driving circuit column ROW2, and a third pixel driving circuit column ROW3 adjacent to each other in sequence. The first pixel driving circuit column ROW1 is correspondingly provided with the eleventh bridging part 511, and the eleventh bridging part 511 may be connected to the ninth bridging part 49 through a via hole to connect to the second initial signal line Vinit2. The second pixel driving circuit column ROW2 is provided with the twelfth bridging part 512 correspondingly, and the twelfth bridging part 512 may be connected to the eighth bridging part 48 through a via hole to connect to the third initial signal line Vinit3. The third pixel driving circuit column ROW3 is provided with the thirteenth bridging part 513 correspondingly, and the thirteenth bridging part 513 may be connected to the second bridging part 42 through a via hole to connect to the first initial signal line Vinit1. As shown in FIGS. 3, 11, and 20, in an exemplary embodiment, the second pixel driving circuit column ROW2 is provided between the first pixel driving circuit column ROW1 and the third pixel driving circuit column ROW3. It should be understood that in other exemplary embodiments, the first pixel driving circuit column ROW1, the second pixel driving circuit column ROW2, and the third pixel driving circuit column ROW3 may be distributed in any arrangement, and other pixel driving circuit columns may be provided among the first pixel driving circuit column ROW1, the second pixel driving circuit column ROW2, and the third pixel driving circuit column ROW3.

As shown in FIGS. 3, 12, 21, the sixth conductive layer may include the second power line VDD2, a first initial connection line 6Vinit1, a second initial connection line 6Vinit2, a third initial connection line 6Vinit3, a third power line VSS, and a fourteenth bridging part 714. An orthographic projection of the second power line VDD2 on the base substrate, an orthographic projection of the first initial connection line 6Vinit1 on the base substrate, an orthographic projection of the second initial connection line 6Vinit2 on the base substrate, an orthographic projection of the third initial connection line 6Vinit3 on the base substrate, and an orthographic projection of the third power line VSS on the base substrate may all extend along the second direction Y. As shown in FIG. 21, the first pixel driving circuit column ROW1 and the second pixel driving circuit column ROW2 may be respectively provided with one second power line VDD2 correspondingly, the second power line VDD2 may be connected to the first power line VDD1 through a via hole, and the second power line VDD2 may further reduce the resistance of the first power line VDD1. The third pixel driving circuit column ROW3 may be correspondingly provided with one third power line VSS, and at least a portion of the third power line VSS is disposed in a display region of the display panel. The third power line VSS may be connected to a common electrode layer of the display panel through a via hole provided in the edge wiring region, the common electrode layer may be provided on a side of the electrode layer away from the base substrate, and the common electrode layer may be used to form the second electrode of the light-emitting unit. The arrangement may reduce the resistance of the common electrode layer of the display panel, thereby reducing the voltage difference between the second electrodes of the light-emitting units at different positions of the display panel, and thus improving the display uniformity of the display panel. The fourteenth bridging part 714 may be connected to the tenth bridging part 510 through a via hole to connect to the second electrode of the sixth transistor.

As shown in FIGS. 3 and 13, the electrode layer may include a plurality of electrode parts, and the plurality of electrode parts may include a first electrode part G, a second electrode part R, and a third electrode part B. The second electrode part R may be an electrode part of a red sub-pixel unit, the third electrode part B may be an electrode part of a blue sub-pixel unit, and the first electrode part G may be an electrode part of a green sub-pixel unit. Each electrode part is connected to the fourteenth bridging part 714 through a via hole, respectively, to connect the first electrode of the light-emitting unit and the second electrode of the sixth transistor. As shown in FIGS. 3, 12, 13, and 21, an orthographic projection, on the base substrate, of the fourteenth bridging part 714 connected to the first electrode part G has a dimension S1 in the second direction Y, an orthographic projection, on the base substrate, of the fourteenth bridging part 714 connected to the second electrode part R has a dimension S2 in the second direction Y, and an orthographic projection, on the base substrate, of the fourteenth bridging part 714 connected to the third electrode part B has a dimension S3 in the second direction Y, where S1 is greater than S2 and S3. S1/S2 may be greater than or equal to 2 and less than or equal to 6, e.g., S1/S2 may be equal to 2, 3, 4, 5, 6; and S1/S3 may be greater than or equal to 2 and less than or equal to 6, e.g., S1/S3 may be equal to 2, 3, 4, 5, 6.

In addition, the square resistance of the electrode layer is greater than the square resistance of the sixth conductive layer. In an exemplary embodiment, the fourteenth bridging part 714 having a longer extension length is connected to the first electrode part G, which can reduce the resistance between the first electrode part G and the second electrode of the sixth transistor T6 in the case where the light-emitting units are arranged normally. In an exemplary embodiment, a pixel defining layer provided on a side of the electrode layer away from the base substrate may further be included, and the pixel defining layer has a plurality of pixel openings formed thereon for forming the light-emitting units. In FIG. 3, the dashed box G1 on the first electrode part G indicates the position of the pixel opening for the green sub-pixel; the dashed box B1 on the third electrode part B indicates the position of the pixel opening for the blue sub-pixel; and the dashed box R1 on the second electrode part R indicates the position of the pixel opening for the red sub-pixel. In an exemplary embodiment, the luminous efficiency of the light-emitting material in the green sub-pixel unit is smaller than the luminous efficiency of the light-emitting material in the red sub-pixel unit, and is larger than the luminous efficiency of the light-emitting material in the blue sub-pixel unit, and accordingly, the area of the pixel opening on the first electrode part G is larger than the area of the pixel opening on the second electrode part R, and is smaller than the area of the pixel opening on the third electrode part B.

It should be noted that, as shown in FIGS. 3, 19, 20, and 21, the black square drawn on the side of the fourth conductive layer away from the base substrate denotes the via hole through which the fourth conductive layer is connected to another layer at the side of the fourth conductive layer facing the base substrate; the black square drawn on the side of the fifth conductive layer away from the base substrate denotes the via hole through which the fifth conductive layer is connected to another layer at the side of the fifth conductive layer facing the base substrate; the black square drawn on the side of the sixth conductive layer away from the base substrate denotes the via hole through which the sixth conductive layer is connected to another layer at the side of the sixth conductive layer facing the base substrate; and the black square drawn on the side of the electrode layer away from the base substrate denotes the via hole through which the electrode layer is connected to another layer at the side of the electrode layer facing the base substrate. The black square indicates only the position of the via hole, and different via holes indicated by the black squares at different positions may pass through different insulating layers.

Figure 22:
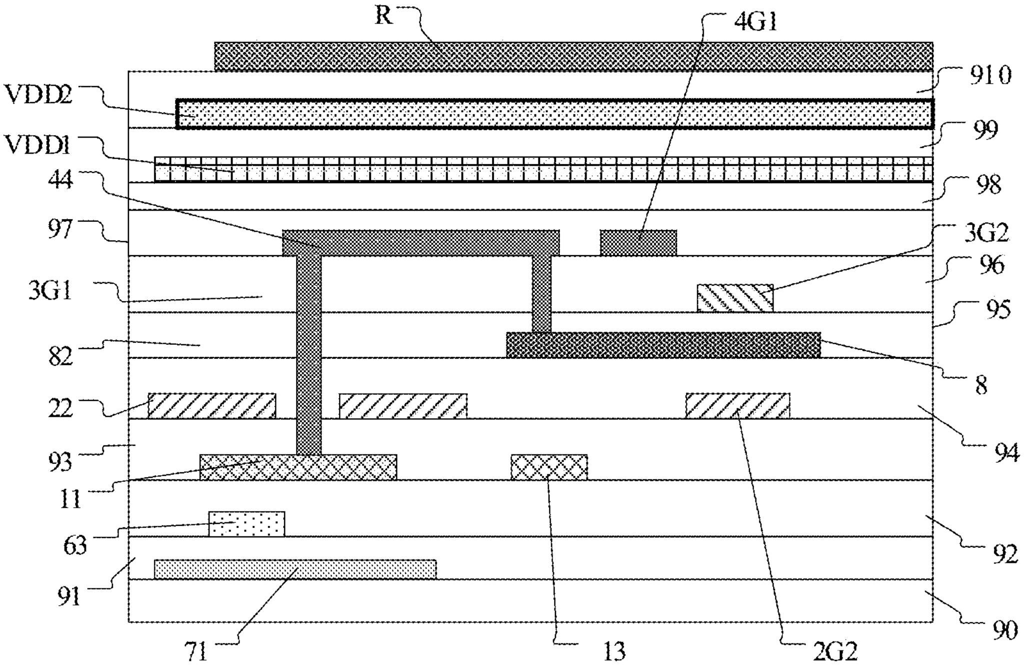
FIG. 22 is a partial sectional view of a display panel shown in FIG. 3 taken along a dashed line AA.

FIG. 22 is a partial sectional view of the display panel shown in FIG. 3 taken along the dashed line AA. The display panel may further include a first insulating layer 91, a second insulating layer 92, a third insulating layer 93, a fourth insulating layer 94, a fifth insulating layer 95, a first dielectric layer 96, a passivation layer 97, a first planarization layer 98, a second planarization layer 99, and a third planarization layer 910. The base substrate 90, the shielding layer, the first insulating layer 91, the first active layer, the second insulating layer 92, the first conductive layer, the third insulating layer 93, the second conductive layer, the fourth insulating layer 94, the second active layer, the fifth insulating layer 95, the third conductive layer, the first dielectric layer 96, the fourth conductive layer, the passivation layer 97, the first planarization layer 98, the fifth conductive layer, the second planarization layer 99, the sixth conductive layer, the third planarization layer 910, and the electrode layer are stacked sequentially. The first insulating layer 91, the second insulating layer 92, the third insulating layer 93, the fourth insulating layer 94, and the fifth insulating layer 95 may be a single-layer structure or a multi-layer structure, and the material of the first insulating layer 91, the second insulating layer 92, the third insulating layer 93, the fourth insulating layer 94, and the fifth insulating layer 95 may be at least one of silicon nitride, silicon oxide, and silicon nitride oxide; the first dielectric layer 96 may be a silicon nitride layer; and the material of the first planarization layer 98, the second planarization layer 99, and the third planarization layer 910 may be an organic material, such as polyimide (PI), polyethylene terephthalate (PET), polyethylene naphthalate (PEN), silicone-glass bonding structure (SOG), and other materials. The base substrate 90 may include a glass substrate, a barrier layer, and a polyimide layer stacked sequentially, and the barrier layer may be an inorganic material. The passivation layer 97 may be a silicon oxide layer. The material of the first conductive layer, the second conductive layer, and the third conductive layer may be one of molybdenum, aluminium, copper, titanium and niobium, or an alloy, or a molybdenum/titanium alloy, or a stacked layer. The material of the fourth conductive layer, the fifth conductive layer, the sixth conductive layer may include a metallic material, for example, it may be one of molybdenum, aluminium, copper, titanium and niobium, or an alloy, or a molybdenum/titanium alloy or a stacked layer, or it may be a titanium/aluminium/titanium stacked layer. The electrode layer may include an indium tin oxide layer, a silver layer. The square resistance of any one of the first conductive layer, the second conductive layer, and the third conductive layer may be greater than the square resistance of any one of the fourth conductive layer, the fifth conductive layer and the sixth conductive layer.

It should be noted that the scale of the accompanying drawings in the present disclosure can be used as a reference in the actual process, but is not limited to thereto. For example, the width-to-length ratio of the channel, the thickness and spacing of each film layer, and the width and spacing of each signal line may be adjusted according to the actual needs. The number of pixels in the display substrate and the number of sub-pixels in each pixel are also not limited to the number shown in the drawings. The accompanying drawings depicted in the present disclosure are only schematic structure diagrams. Furthermore, the terms first, second, and the like are only used to define different structure names, which do not define a particular order.

An exemplary embodiment also provides a display device including the display panel as described above. The display device may be a display device such as a mobile phone, a tablet computer, a television, and the like.

A person skilled in the art may easily conceive of other embodiments of the present disclosure upon consideration of the specification and practice of what is disclosed herein. The present application is intended to cover any variations, uses, or adaptations of the present disclosure that follow the general principle of the present disclosure and include the common knowledge or conventional technical means in the art which is not disclosed herein. The specification and embodiments are to be regarded as exemplary only, and the true scope and spirit of the present disclosure is indicated by the claims.

It should be understood that the present disclosure is not limited to the precise structure which has been described above and illustrated in the accompanying drawings, and that various modifications and alterations may be made without departing from the scope thereof. The scope of the present disclosure is limited only by the appended claims.

What is claimed is:

1. A display panel comprising a base substrate and a plurality of pixel driving circuits provided on a side of the base substrate, wherein each of the pixel driving circuits comprises:

a driving transistor;

a ninth transistor having a first electrode connected to a third initial signal line and a second electrode connected to a first electrode of the driving transistor;

an eighth transistor having a first electrode connected to a gate electrode of the driving transistor;

a first transistor having a first electrode connected to a first initial signal line and a second electrode connected to a second electrode of the eighth transistor; and a second transistor having a first electrode connected to the second electrode of the eighth transistor and a second electrode connected to a second electrode of the driving transistor, wherein the plurality of pixel driving circuits are arranged in an array along a first direction and a second direction, and the first direction is intersected with the second direction, wherein each of the plurality of pixel driving circuits further comprises a capacitor having a first electrode connected to the gate electrode of the driving transistor and a second electrode connected to a first power line, and the display panel further comprises:

a second conductive layer provided on a side of the base substrate and comprising a plurality of second conductive parts, a respective one of the second conductive parts being configured to form the second electrode of the capacitor;

a fourth conductive layer provided on a side of the second conductive layer away from the base substrate and comprising a power connection line, an orthographic projection of the power connection line on the base substrate extending in the first direction, the power connection line being respectively connected to the plurality of second conductive parts through via holes, orthographic projections, on the base substrate, of the plurality of second conductive parts connected to a same power connection line being spaced apart along the first direction; and a fifth conductive layer provided on a side of the fourth conductive layer away from the base substrate and comprising the first power line, an orthographic projection of the first power line on the base substrate extending in the second direction, and the first power line being connected to the power connection line with the orthographic projection on the base substrate intersecting with the orthographic projection of the first power line on the base substrate, and wherein the display panel further comprises:

a sixth conductive layer provided on a side of the fifth conductive layer away from the base substrate and comprising a second power line, an orthographic projection of the second power line on the base substrate extending in the second direction, and the second power line being connected to the first power line through a via hole.

2. The display panel according to claim 1, wherein the display panel further comprises a plurality of light-emitting units, and the pixel driving circuits are respectively connected to first electrodes of the light-emitting units, wherein the sixth conductive layer further comprises a third power line, an orthographic projection of the third power line on the base substrate extending in a second direction; and the display panel further comprises: a common electrode layer provided on a side of the sixth conductive layer away from the base substrate and configured to form second electrodes of the light-emitting units, wherein the third power line is at least partially provided in a display area of the display panel, and the third power line is connected to the common electrode layer through a via hole.

3. The display panel according to claim 1, wherein the display panel further comprises a plurality of light-emitting units, and each of the pixel driving circuits further comprises a seventh transistor having a first electrode connected to a second initial signal line and a second electrode connected to a first electrode of a respective one of the light-emitting units, wherein the second conductive layer further comprises the second initial signal line, an orthographic projection of the second initial signal line on the base substrate extending in a first direction; and wherein the sixth conductive layer further comprises a second initial connection line, the second initial connection line being connected to the second initial signal line with the orthographic projection on the base substrate intersected with an orthographic projection of the second initial connection line on the base substrate.

4. The display panel according to claim 1, wherein the second conductive layer further comprises the first initial signal line, an orthographic projection of the first initial signal line on the base substrate extending in a first direction; and the sixth conductive layer further comprises a first initial connection line, the first initial connection line being connected to the first initial signal line with the orthographic projection on the base substrate intersected with an orthographic projection of the first initial connection line on the base substrate.

5. The display panel according to claim 1, wherein the display panel further comprises:

a third conductive layer provided on a side of the base substrate and comprising the third initial signal line, an orthographic projection of the third initial signal line on the base substrate extending in a first direction; and wherein the sixth conductive layer is provided on a side of the third conductive layer away from the base substrate and further comprises a third initial connection line, the third initial connection line being connected to the third initial signal line with the orthographic projection on the base substrate intersected with an orthographic projection of the third initial connection line on the base substrate.

6. The display panel according to claim 1, wherein the display panel further comprises:

a first conductive layer provided on a side of the base substrate and comprising a first conductive part configured to form the gate electrode of the driving transistor; and a second active layer provided on a side of the first conductive layer away from the base substrate and comprising a sub-active part, the sub-active part comprising an eighth active part and a twentieth active part connected to the eighth active part, and the eighth active part being configured to form a channel region of the eighth transistor; and wherein the fourth conductive layer is provided on a side of the second active layer away from the base substrate and comprising a fourth bridging part, the fourth bridging part being connected to the twentieth active part through a first via hole and to the first conductive part through a second via hole.

7. The display panel according to claim 6, wherein the display panel further comprises:

a first active layer provided between the base substrate and the first conductive layer and comprising a second active part, the second active part being configured to form a channel region of the second transistor, the first conductive layer further comprises:

a first gate line, an orthographic projection of the first gate line on the base substrate extending in a first direction and covering an orthographic projection of the second active part on the base substrate, and a portion of the first gate line being configured to form a gate electrode of the second transistor; and a third conductive part connected to the first gate line, an orthographic projection of the third conductive part on the base substrate being located at a side, facing an orthographic projection of the first conductive part on the base substrate, of the orthographic projection of the first gate line on the base substrate, wherein the orthographic projection of the third conductive part on the base substrate is at least partially overlapped with an orthographic projection of the first via hole on the base substrate.

8. The display panel according to claim 6, wherein each of the pixel driving circuits further comprises a fifth transistor having a first electrode connected to a first power line and a second electrode connected to the first electrode of the driving transistor, the orthographic projection of the first power line on the base substrate covers an orthographic projection of the sub-active part on the base substrate and an orthographic projection of the fourth bridging part on the base substrate.

9. The display panel according to claim 8, wherein each of the pixel driving circuits further comprises a fourth transistor having a first electrode connected to a data line and a second electrode connected to the first electrode of the driving transistor, the display panel further comprises:

a first active layer provided between the base substrate and the first conductive layer and comprising a second active part and a fourth active part, the second active part being configured to form a channel region of the second transistor, and the fourth active part being configured to form a channel region of the fourth transistor, in a first direction, an orthographic projection of the eighth active part on the base substrate is located between an orthographic projection of the second active part on the base substrate and an orthographic projection of the fourth active part on the base substrate.

10. The display panel according to claim 1, wherein the display panel comprises a plurality of light-emitting units respectively corresponding to the plurality of pixel driving circuits, and each of the pixel driving circuits further comprises a sixth transistor having a first electrode connected to the second electrode of the driving transistor, wherein the sixth conductive layer further comprises a plurality of fourteenth bridging parts, the fourteenth bridging parts being respectively provided in correspondence with the pixel driving circuits and each being connected to a second electrode of the sixth transistor in a respective one of the pixel driving circuits; and wherein the display panel further comprises: an electrode layer provided on a side of the sixth conductive layer away from the base substrate and comprising a plurality of electrode parts, each of the electrode parts being configured to form a first electrode of a respective one of the light-emitting units, and being connected, through a via hole, to a respective one of the fourteenth bridging parts, the plurality of electrode parts comprises a first electrode part, a second electrode part, and a third electrode part, the first electrode part is configured to form a first electrode of a first color light-emitting unit, the second electrode part is configured to form a first electrode of a second color light-emitting unit, and the third electrode part is configured to form a first electrode of a third color light-emitting unit, wherein an orthographic projection, on the base substrate, of a fourteenth bridging part of the fourteenth bridging parts connected to the first electrode part has a dimension of S1 in a second direction, an orthographic projection, on the base substrate, of a fourteenth bridging part of the fourteenth bridging parts connected to the second electrode part has a dimension of S2 in the second direction, and an orthographic projection, on the base substrate, of a fourteenth bridging part of the fourteenth bridging parts connected to the third electrode part has a dimension of S3 in the second direction, where S1 is greater than S2 and S3.

11. The display panel according to claim 10, wherein the display panel further comprises:

a first conductive layer provided between the base substrate and the sixth conductive layer and comprising a first gate line, a portion of the first gate line being configured to form a gate electrode of the second transistor, wherein an orthographic projection of the fourteenth bridging part connected to the first electrode part on the base substrate is intersected with an orthographic projection of the first gate line on the base substrate.

12. The display panel according to claim 1, wherein the display panel further comprises a plurality of light-emitting units, and each of the pixel driving circuits further comprises:

a fourth transistor having a first electrode connected to a data line and a second electrode connected to the first electrode of the driving transistor;

a fifth transistor having a first electrode connected to a first power line and a second electrode connected to the first electrode of the driving transistor;

a sixth transistor having a first electrode connected to the second electrode of the driving transistor and a second electrode connected to a first electrode of the light-emitting unit; and a seventh transistor having a first electrode connected to a second initial signal line and a second electrode connected to the first electrode of the light-emitting unit, the display panel further comprises:

a first active layer provided on a side of the base substrate and comprising a first active part, a second active part, a third active part, a fourth active part, a fifth active part, a sixth active part, a seventh active part, and a ninth active part;

wherein the first active part is configured to form a channel region of the first transistor, the second active part is configured to form a channel region of the second transistor, the third active part is configured to form a channel region of the driving transistor, the fourth active part is configured to form a channel region of the fourth transistor, the fifth active part is configured to form a channel region of the fifth transistor, the sixth active part is configured to form a channel region of the sixth transistor, the seventh active part is configured to form a channel region of the seventh transistor, and the ninth active part is configured to form a channel region of the ninth transistor, a first conductive layer is provided on a side of the first active layer away from the base substrate and comprises a first reset signal line, a second reset signal line, an enable signal line, a first gate line, and a first conductive part, wherein an orthographic projection of the first conductive part on the base substrate covers an orthographic projection of the third active part on the base substrate, and the first conductive part is configured to form the gate electrode of the driving transistor, an orthographic projection of the first reset signal line on the base substrate extends in a first direction and covers the orthographic projection of the first active part on the base substrate, and a portion of the first reset signal line is configured to form a gate electrode of the first transistor, an orthographic projection of the second reset signal line on the base substrate extends in the first direction and coves an orthographic projection of the seventh active part on the base substrate and an orthographic projection of the ninth active part on the base substrate, a portion of the first reset signal line is configured to form a gate electrode of the seventh transistor, and another portion of the first reset signal line is configured to form a gate electrode of the ninth transistor, an orthographic projection of the first gate line on the base substrate extends in the first direction and covers an orthographic projection of the second active part on the base substrate and an orthographic projection of the fourth active part on the base substrate, a portion of the first gate line is configured to form a gate electrode of the second transistor, and another portion of the first gate line is configured to form a gate electrode of the fourth transistor, the orthographic projection of the first conductive part on the base substrate is located between an orthographic projection of the enable signal line on the base substrate and the orthographic projection of the first gate line on the base substrate, the orthographic projection of the first reset signal line on the base substrate is located at a side, away from the orthographic projection of the first conductive part on the base substrate, of the orthographic projection of the first gate line on the base substrate, and the orthographic projection of the second reset signal line on the base substrate is located at a side, away from the orthographic projection of the first conductive part on the base substrate, of the orthographic projection of the enable signal line on the base substrate.

13. The display panel according to claim 12, wherein the first reset signal line in a pixel driving circuit of the plurality of pixel driving circuits in a current row is reused as the second reset signal line in a pixel driving circuit of the plurality of pixel driving circuits in an adjacent previous row.

14. The display panel according to claim 12, wherein the display panel further comprises:

a second active layer provided on a side of the first conductive layer away from the base substrate and comprising an eighth active part, the eighth active part being configured to form a channel region for the eighth transistor;

a third conductive layer provided on a side of the second active layer away from the base substrate and comprising a second gate line, an orthographic projection of the second gate line on the base substrate covering an orthographic projection of the eighth active part on the base substrate, and a portion of the second gate line being configured to form a top gate of the eighth transistor, the orthographic projection of the second gate line on the base substrate is located between the orthographic projection of the first gate line on the base substrate and the orthographic projection of the first reset signal line on the base substrate.

15. The display panel according to claim 14, wherein the second conductive layer is provided between the first conductive layer and the second active layer and comprises the first initial signal line and the second initial signal line, wherein in a pixel driving circuit of the plurality of pixel driving circuits in a same row, an orthographic projection of the first initial signal line on the base substrate is located at a side, away from the orthographic projection of the first conductive part on the base substrate, of the orthographic projection of the first reset signal line on the base substrate, an orthographic projection, on the base substrate, of the second initial signal line in a pixel driving circuit of the plurality of pixel driving circuits in an adjacent previous row is located between the orthographic projection, on the base substrate, of the first reset signal line in a pixel driving circuit of the plurality of pixel driving circuits in a current row and the orthographic projection, on the base substrate, of the second gate line in the pixel driving circuit in the current row, the third conductive layer further comprises:

the third initial signal line, an orthographic projection, on the base substrate, of the third initial signal line in the pixel driving circuit in the adjacent previous row being located between the orthographic projection, on the base substrate, of the second initial signal line in the pixel driving circuit in the adjacent previous row and the orthographic projection, on the base substrate, of the first reset signal line in the pixel driving circuit in the current row.

16. The display panel according to claim 12, wherein the first transistor, the second transistor, the driving transistor, the fourth transistor, the fifth transistor, the sixth transistor, the seventh transistor and the ninth transistor are P-type transistors, and the eighth transistor is an N-type transistor.

17. The display panel according to claim 1, wherein the display panel further comprises:

a first conductive layer provided on a side of the base substrate and comprising a gate line, the gate line comprising a plurality of gate line sections, orthographic projections, on the base substrate, of the plurality of gate line sections of a same gate line being spaced apart in a first direction and extending in the first direction, and a portion of the gate line being configured to form a gate electrode of a transistor in the pixel driving circuit; and wherein the fourth conductive layer is provided on a side of the first conductive layer away from the base substrate and further comprises a gate line-connecting line, the orthographic projection of the gate line-connecting lines on the base substrate extending in the first direction and being respectively connected to the plurality of gate line sections of the same gate line through via holes, wherein a square resistance of the first conductive layer is greater than a square resistance of the fourth conductive layer.

18. A display device comprising a display panel, wherein the display panel comprises a base substrate and a plurality of pixel driving circuits provided on a side of the base substrate, and each of the pixel driving circuits comprises:

a driving transistor;

a ninth transistor having a first electrode connected to a third initial signal line and a second electrode connected to a first electrode of the driving transistor;

an eighth transistor having a first electrode connected to a gate electrode of the driving transistor;

a first transistor having a first electrode connected to a first initial signal line and a second electrode connected to a second electrode of the eighth transistor; and a second transistor having a first electrode connected to the second electrode of the eighth transistor and a second electrode connected to a second electrode of the driving transistor, wherein the plurality of pixel driving circuits are arranged in an array along a first direction and a second direction, and the first direction is intersected with the second direction, wherein each of the plurality of pixel driving circuits further comprises a capacitor having a first electrode connected to the gate electrode of the driving transistor and a second electrode connected to a first power line, and the display panel further comprises:

a second conductive layer provided on a side of the base substrate and comprising a plurality of second conductive parts, a respective one of the second conductive parts being configured to form the second electrode of the capacitor;

a fourth conductive layer provided on a side of the second conductive layer away from the base substrate and comprising a power connection line, an orthographic projection of the power connection line on the base substrate extending in the first direction, the power connection line being respectively connected to the plurality of second conductive parts through via holes, orthographic projections, on the base substrate, of the plurality of second conductive parts connected to a same power connection line being spaced apart along the first direction; and a fifth conductive layer provided on a side of the fourth conductive layer away from the base substrate and comprising the first power line, an orthographic projection of the first power line on the base substrate extending in the second direction, and the first power line being connected to the power connection line with the orthographic projection on the base substrate intersecting with the orthographic projection of the first power line on the base substrate, and wherein the display panel further comprises:

a sixth conductive layer provided on a side of the fifth conductive layer away from the base substrate and comprising a second power line, an orthographic projection of the second power line on the base substrate extending in the second direction, and the second power line being connected to the first power line through a via hole.

* * * * *